(12) United States Patent
Mintz et al.

(10) Patent No.: US 11,178,781 B2
(45) Date of Patent: Nov. 16, 2021

(54) ETCHING FOR BONDING POLYMER MATERIAL TO A METAL SURFACE

(71) Applicant: Apple Inc., Cupertino, CA (US)

(72) Inventors: Todd S. Mintz, San Jose, CA (US); Shi Hua Zhang, Wilmington, DE (US); Abhijeet Misra, Sunnyvale, CA (US); Eric W. Hamann, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 92 days.

(21) Appl. No.: 16/125,409

(22) Filed: Sep. 7, 2018

(65) Prior Publication Data

US 2019/0098785 A1 Mar. 28, 2019

Related U.S. Application Data

(60) Provisional application No. 62/763,140, filed on Dec. 13, 2017, provisional application No. 62/556,087, filed on Sep. 8, 2017.

(51) Int. Cl.
*H05K 5/02* (2006.01)
*C25F 3/14* (2006.01)
(Continued)

(52) U.S. Cl.
CPC ...... *H05K 5/0217* (2013.01); *B29C 45/14311* (2013.01); *C25D 11/08* (2013.01);
(Continued)

(58) Field of Classification Search
CPC .... H05K 5/063; H05K 5/0217; H05K 5/0004; H05K 5/0086; H05K 5/04;
(Continued)

(56) References Cited

U.S. PATENT DOCUMENTS 4,300,970 A 11/1981 Honda et al.
6,261,863 B1 7/2001 Beroz et al.
(Continued)

FOREIGN PATENT DOCUMENTS

CN 102480880 A 5/2012
CN 103448200 A 12/2013
(Continued)

OTHER PUBLICATIONS

Translation of WO2016114174 (abstract, description and claims). (Year: 2016).*
(Continued)

*Primary Examiner* — Catherine A. Simone
(74) *Attorney, Agent, or Firm* — Dorsey & Whitney LLP

(57) ABSTRACT

This application relates to a composite part that can include a non-metal layer having attachment features, and a metal part that is joined with the non-metal layer. The metal part can include a plurality of interlocking structures that are disposed at an external surface of the metal part, where each of the interlocking structures can include an opening characterized as having a first width, and an undercut region, where the opening leads into the undercut region, and the undercut region is characterized as having a second width that is greater than the first width such that the undercut region captures and retains one of the attachment features of the non-metal layer.

12 Claims, 25 Drawing Sheets

(51) Int. Cl.

| | |
|---|---|
| *B29C 45/14* | (2006.01) |
| *C25D 11/10* | (2006.01) |
| *C25D 11/08* | (2006.01) |
| *H05K 5/00* | (2006.01) |
| *H05K 5/04* | (2006.01) |
| *H05K 5/06* | (2006.01) |
| *C23F 1/02* | (2006.01) |
| *H04M 1/02* | (2006.01) |
| *C23G 1/12* | (2006.01) |
| *B29K 705/00* | (2006.01) |
| *C23F 1/20* | (2006.01) |

(52) U.S. Cl.
CPC .............. *C25D 11/10* (2013.01); *C25F 3/14* (2013.01); *H04M 1/0283* (2013.01); *H05K 5/0004* (2013.01); *H05K 5/0086* (2013.01); *H05K 5/04* (2013.01); *H05K 5/063* (2013.01); *B29K 2705/00* (2013.01); *C23F 1/02* (2013.01); *C23F 1/20* (2013.01); *C23G 1/125* (2013.01); *Y10T 428/24521* (2015.01); *Y10T 428/24545* (2015.01)

(58) Field of Classification Search
CPC ..... B29C 45/14311; B29C 2045/14327; B29C 45/14778; B29C 2045/14868; B32B 15/08; B32B 3/30; C25D 11/08; C25D 11/10; C25D 11/12; C25D 11/04; C25D 11/02; C25D 11/022; C25F 3/14; H04M 1/0283; C23F 1/02; C23F 1/20; Y10T 428/24545; Y10T 428/24521
USPC .................................................. 428/161, 164
See application file for complete search history.

(56) References Cited

U.S. PATENT DOCUMENTS

| | | |
|---|---|---|
| 6,426,870 B1 | 7/2002 | Oross et al. |
| 6,786,876 B2 | 9/2004 | Cox |
| 9,280,183 B2 | 3/2016 | Tatebe |
| 9,591,110 B2 | 3/2017 | Hill et al. |
| 2009/0017242 A1 | 1/2009 | Weber et al. |
| 2012/0094108 A1 | 4/2012 | Chang et al. |
| 2013/0153427 A1 | 6/2013 | Tatebe |
| 2015/0183185 A1 | 7/2015 | Chang |
| 2015/0273795 A1 | 10/2015 | Koizumi et al. |
| 2016/0167353 A1* | 6/2016 | Fan .................... B32B 27/08 216/39 |
| 2017/0136668 A1 | 5/2017 | Kose et al. |
| 2017/0203368 A1 | 7/2017 | Maderud et al. |
| 2017/0259468 A1* | 9/2017 | Nishikawa ........... B23K 26/352 |
| 2017/0291394 A1* | 10/2017 | Chang ............... B29C 45/14311 |
| 2018/0093312 A1 | 4/2018 | Ran et al. |

FOREIGN PATENT DOCUMENTS

| | | | |
|---|---|---|---|
| CN | 103451704 A | 12/2013 | |
| CN | 104736337 A | 6/2015 | |
| CN | 106835139 A | 6/2017 | |
| EP | 3184233 A1 | 6/2017 | |
| JP | 2016043382 A | 4/2016 | |
| JP | 2017087567 A | 5/2017 | |
| KR | 10-1690592 A | 6/2015 | |
| KR | 10-2015-0067300 A | 12/2016 | |
| WO | 2009151099 A1 | 12/2009 | |
| WO | 2014061520 A1 | 4/2014 | |
| WO | WO-2016027777 A1 * | 2/2016 | ......... B23K 26/0006 |
| WO | WO-2016114174 A1 * | 7/2016 | ......... B23K 26/0622 |

OTHER PUBLICATIONS

Tawfick et al., "Engineering of Micro- and Nanostructured Surfaces with Anisotropic Geometries and Properties," Advanced Materials, vol. 24, Issue 13, Apr. 3, 2012, pp. 1628-1674.
G.W. Critchlow and D.M. Brewis, "Review of surface pretreatments for aluminium alloys", Int. J. Adhesion and Adhesives 16 (1996) 255-275.
R.P. Digby and D.E. Packham, "Pretreatment of aluminium: topography, surface chemistry and adhesive bond durability", Int. J. Adhesion and Adhesives 15 (1995) 61-71.
European Patent Application 18191706.3—Extended European Search Report dated Jan. 21, 2019.

* cited by examiner

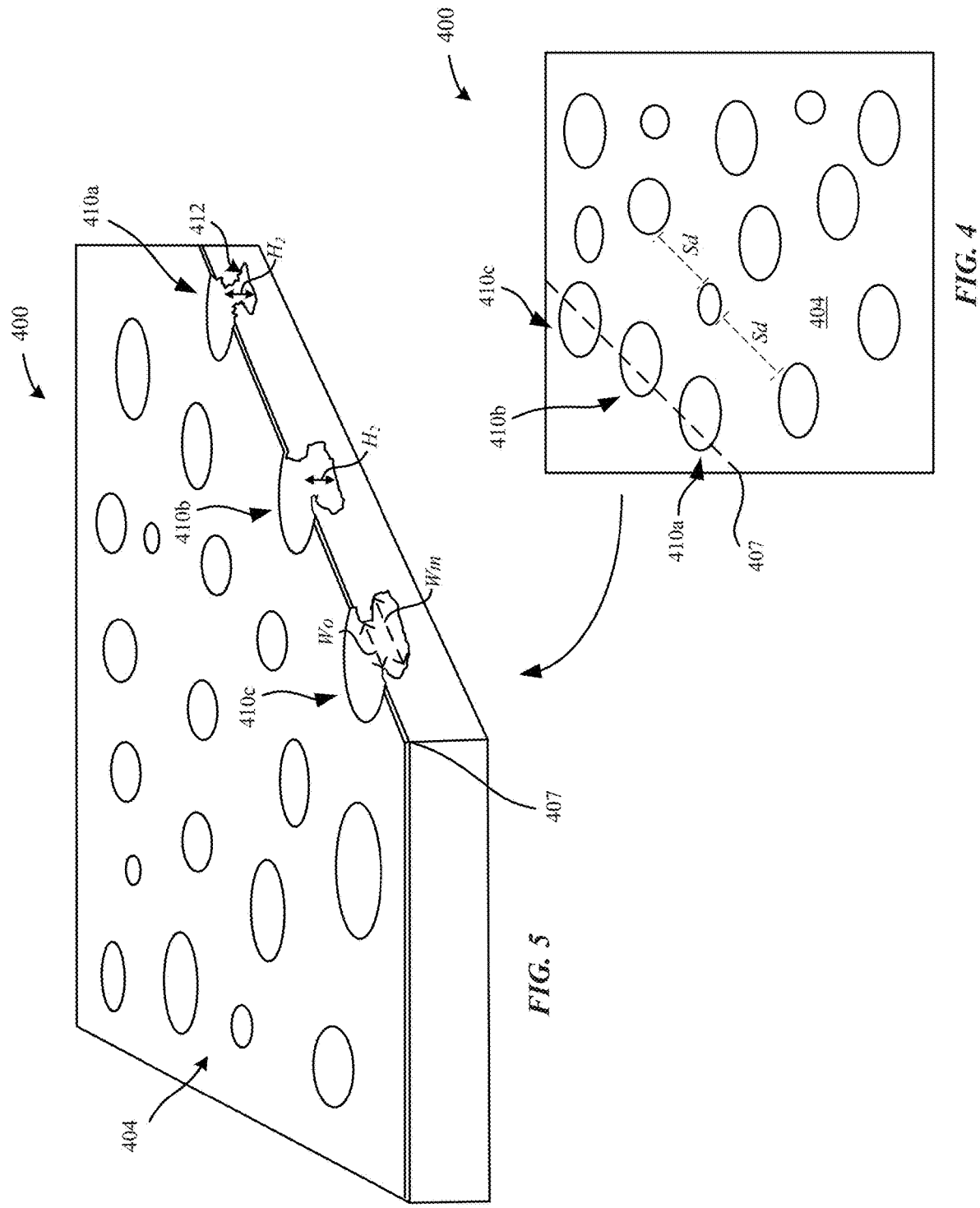

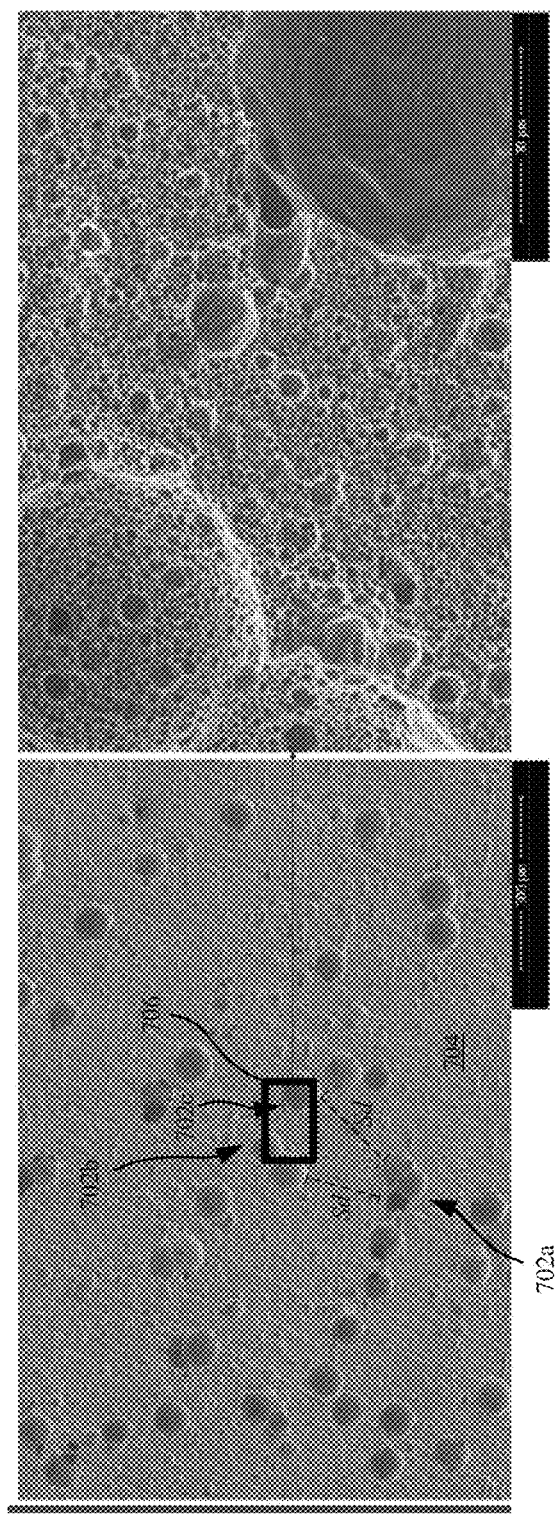

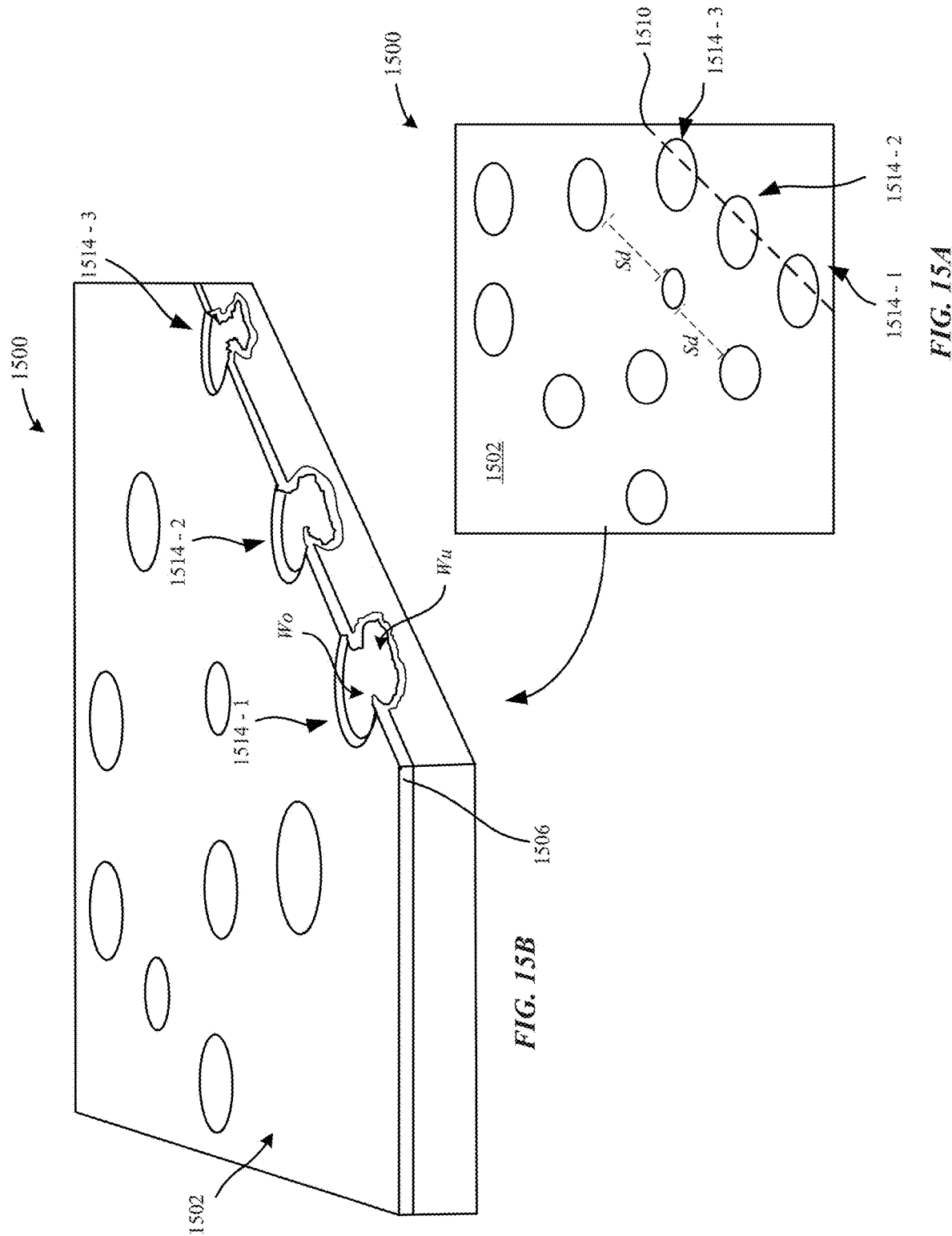

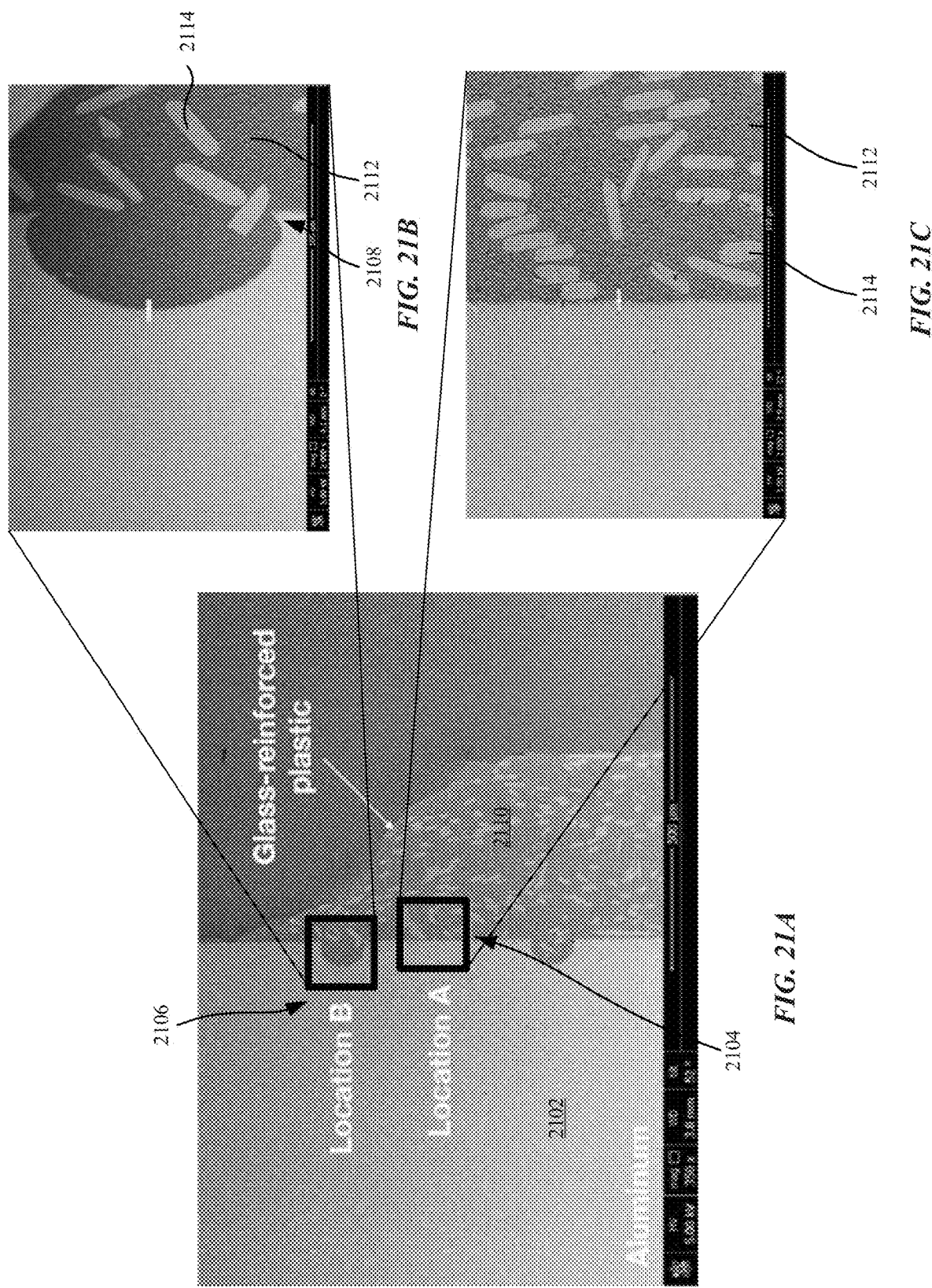

ETCHING FOR BONDING POLYMER MATERIAL TO A METAL SURFACE

CROSS-REFERENCE TO RELATED APPLICATIONS

The present application claims the benefit of both U.S. Provisional Application No. 62/763,140, entitled "ETCHING FOR BONDING POLYMER MATERIAL TO A METAL SURFACE," filed Dec. 13, 2017, and U.S. Provisional Application No. 62/556,087, entitled "ETCHING FOR BONDING POLYMER MATERIAL TO A METAL SURFACE," filed Sep. 8, 2017, which are incorporated by reference herein in their entirety for all purposes.

FIELD

The described embodiments relate generally to techniques for etching a surface of a metal part. More particularly, the described embodiments relate to systems and methods for forming interlocking structures at the surface of the metal part for attaching a polymer material to the metal part.

BACKGROUND

Enclosures for consumer devices are typically constructed from a combination of metal and non-metal materials in order to provide functional, structural, and cosmetic enhancements. However, metals may lack a natural ability to attach to these non-metal materials. Techniques for modifying the metal in order to facilitate attachment to the non-metal material can require a considerable amount of time, expense, and effort. Furthermore, despite being able to attach the non-metal material to the metal material, these techniques may be unable to provide the necessary amount of pull strength between the metal and the non-metal material. Additionally, these techniques may be unable to inhibit the underlying metal from becoming exposed to moisture and contaminants, thereby greatly reducing the useful life of the metal.

SUMMARY

This paper describes various embodiments that relate to techniques for etching a surface of a metal part. In particular, the various embodiments relate to systems and methods for forming interlocking structures at the surface of the metal part for attaching a polymer material to the metal part.

According to some embodiments, a composite part is described. The composite part can include a first part having a substrate formed of a first material and having an external surface across which are randomly distributed interlocking structures that extend into the substrate, where the interlocking structures include an opening characterized as having a first width at the external surface, and that leads into an undercut region that is characterized as having a second width that is greater than the first width. The composite part can further include a second part formed of a second material and including a bulk layer at the external surface and micro-portions having (i) a first portion that extends through the opening from the bulk layer, and (ii) a second portion that extends from the first portion and that completely fills and is retained within the undercut region.

According to some embodiments, a multi-piece enclosure for an electronic device is described. The multi-piece enclosure can include a first piece including a metal substrate overlaid by a metal oxide layer, the metal oxide layer having an external surface over which are randomly distributed openings having a first width that lead into recessed structures having a second width and that extend from the external surface and into the metal substrate, where the recessed structures (i) are separated from each other by at least a minimal separation distance, and (ii) are characterized as having an undercut geometry. The multi-piece enclosure can further include a second piece formed of a non-metal material having a bulk portion with protruding features that extend through the openings and into and filling the recessed structures such that the first piece and the second piece are locked together.

According to some embodiments, a method for forming multiple interlocking structures at an external surface of a part that includes a metal substrate overlaid by a primary metal oxide layer, is described. The method can include forming first interlocking structures at locations corresponding to primary metal oxide defects at an external surface of the primary metal oxide layer by exposing the part to a metal etching solution, where the first interlocking structures include an opening having a first width at the external surface that leads to a primary recessed portion having an undercut geometry with a second width greater than the first width. The method can further include subsequent to forming the first interlocking structures, allowing formation of a native oxide layer by removing the part from the metal etching solution and exposing the part to a native atmosphere. The method can further include forming second interlocking structures at locations corresponding to native oxide defects of the native oxide layer by exposing the part to the metal etching solution.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

FIGS. 4-5 illustrate views of a metal part having multiple interlocking structures, in accordance with some embodiments.

FIGS. 7A-7B illustrate exemplary images of views of a metal part having interlocking structures using the techniques described herein, in accordance with some embodiments.

FIGS. 15A-15B illustrate views of an anodized metal part having multiple interlocking structures, in accordance with some embodiments.

FIGS. 21A-21C illustrate exemplary images of views of an anodized metal part bonded to a non-metal part using the techniques described herein, in accordance with some examples.

DETAILED DESCRIPTION

Figure 1:
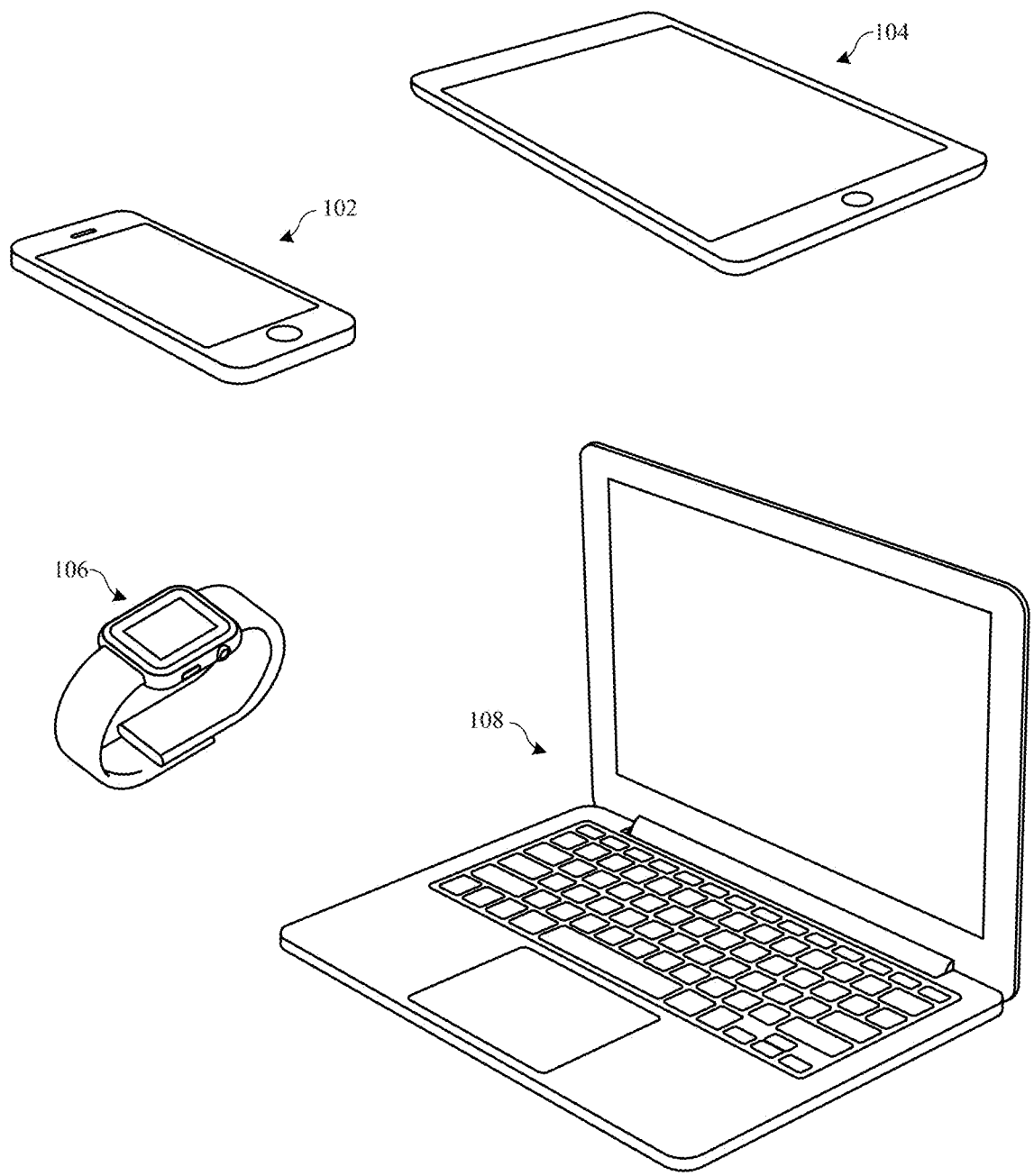
FIG. 1 illustrates perspective views of various devices having metallic surfaces that can be processed using the techniques described herein, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein set forth techniques for forming interlocking structures at a surface of a metal part in order to facilitate attaching a non-metal material (e.g., polymeric material, etc.) to the metal part. In particular, enclosures for portable electronic devices can utilize a combination of metal and non-metal materials in order to provide a combination of structural and/or cosmetic improvements to these enclosures. However, metal can lack a natural ability to attach to the non-metal material (e.g., polymer, glass, ceramics, etc.). For example, certain metals, such as stainless steel and anodized aluminum, can include a metal substrate and a metal oxide layer that overlays the metal substrate. In particular, the metal oxide layer generally prevents corrosion of the underlying metal substrate caused by liquid and other contaminants, which would otherwise reduce the useful life of the metal part. While the metal oxide layer can be beneficial in inhibiting corrosion of the underlying metal substrate, the metal/oxide can be characterized as having a smooth and flat external surface finish, which can contribute to difficulties in attaching the non-metal material to the external surface.

One technique for attaching a non-metal material to a metal part can include machining notches into an external surface of the metal part. However, this machining process may have shortcomings when relied upon to produce a high volume of enclosures as the machining process can involve a considerable amount of time, expense, and effort. Furthermore, the notches that are formed at the external surface of the metal part can be characterized as having a generally smooth surfaces. However, these smooth surfaces can lack a watertight seal that can inhibit moisture and other contaminants from reaching the underlying metal substrate of the metal part. In particular, these smooth surfaces define a direct leakage path from the external surface of the metal part to the underlying metal substrate. Moreover, filling in these notches with a polymeric material, such as through an injection molding process, generally fails to cure this problem as the shape of the polymeric material simply mirrors the smooth surfaces of these notches.

The embodiments described herein set forth techniques for forming separately and discrete interlocking structures at an external surface of a metal part. In particular, each of these discrete interlocking structures can be capable of receiving attachment features of a non-metal material. In some examples, these separately interlocking structures can be referred to as etched interlocking structures that are formed as a result of exposing the metal part to an etching process. In some examples, each of these interlocking structures can include an undercut region for capturing an attachment feature. In some examples, each of these interlocking structures can be overlaid by a metal oxide layer to further increase pull strength and increase moisture-resistance.

According to some embodiments, it is preferable that the interlocking structures are capable of exerting a significant amount of attachment strength onto the attachment features of the non-metal material such as to prevent the non-metal material from becoming forcefully pulled away from the metal part. For example, if the enclosure of the portable device is dropped onto the floor or subjected to physical damage, the non-metal material may attempt to separate from the metal part. Beneficially, the greater the attachment strength (e.g., pull strength) of these interlocking structures, the less likely that the non-metal material will separate from the metal part.

It should be noted that the techniques in the embodiments described herein can prevent over-etching of the external surface of the metal part with interlocking structures. In particular, over-etching of the interlocking structures at the external surface can be undesirable in that it may actually significantly reduce the attachment strength between the metal part and the non-metal material relative to an external surface having a moderate amount of etching. As described herein, over-etching of the external surface can refer to the formation of interlocking structures that cover between about 80% to about 100% of a total surface area of the external surface. In contrast, the moderate amount of etching of the external surface can refer to the formation of interlocking structures that cover between about 25% to about 70% of the total surface area of the external surface. In particular, over-etching of the external surface is characterized by multiple voids overlapping with one another at a single region that results in formation of a single staggered interlocking structure at the single region. The staggered interlocking structure contrasts from an interlocking structure in that the staggered interlocking structure includes an opening having a size (e.g., diameter) that is greater than a capture region which is disposed below the opening. In some examples, the opening of the staggered interlocking structure is greater than the capture region because over-etching of the external surface etches away a majority of the material of the metal part closer towards the external surface rather than away from the external surface. Indeed, over-etched external surfaces are characterized as having rough and uneven external surfaces. Moreover, over-etching of the external surface can cause multiple interlocking structures to form partially over and onto each other, which can lead to decreased separation distance between each of these interlocking structures, increased density of void formation at a single region, as well as detract from the clearly defined shape and size of each interlocking structure. For instance, staggered interlocking structures that are formed as a result of over-etching the external surface are disposed immediately adjacent or overlapping with each other. Consequently, the ability for these staggered interlocking structures to maintain attachment to the non-metal material is significantly impacted. In particular, the staggered interlocking structures associated with over-etching of the metal part can compromise the structural integrity of the metal part and form an uneven attachment surface for attaching a non-metal material to the metal part. Additionally, over-etching can also alter the geometry or dimensions of the metal part, which consequently renders the metal part outside of a specified manufacturing tolerance level. Furthermore, over-etching can change the gap and structure of the metal part. This is particularly of consequence in metal parts of enclosures that have antenna splits or lines, as changing the gap size and the structure of the antenna splits can negatively affect the performance of a wireless antenna that is included within a cavity of the enclosure. For example, the etched interlocking structures that are formed at the splits can be capable of receiving a non-metal material (e.g., injection molded plastic). However, if the interlocking structures are over-etched at these splits, it can lead to diminished binding strength between the metal part and the non-metal material.

According to some embodiments, interlocking structures can be associated with an external surface having a moderate amount of etching (e.g., between about 25% to about 70% of a total surface area of the external surface). In contrast to staggered interlocking structures that are formed overlapping or touching each other, the interlocking structures are generally separated by a sufficient amount of separation distance that generally prevents any compromise in a respective attachment strength of each interlocking structure. Additionally, the external surface with the moderate amount of etching exhibits reduced pit density relative to an overly-etched external surface. Furthermore, the interlocking structures are also characterized as having an opening with a size (e.g., diameter) that is less than an undercut region that is disposed below the opening. In some embodiments, the undercut region of the interlocking structure can be referred to as such because material (e.g., metal oxide, metal substrate, etc.) of the metal part overhangs and defines the undercut region. In some examples, the size of the opening of the interlocking structure is significantly less than the size of the undercut region because a majority of the material of the metal part at the surface remains intact. Indeed, the moderately etched surface having interlocking structures exhibits a generally smooth surface, and in some instances, the sides of the metal part that define the opening have a generally uniform thickness.

Aluminum is frequently cited as a material of choice for consumer-grade portable electronic devices. Indeed, aluminum has desirable attributes such as high specific strength and stiffness, and is relatively easy to machine. Moreover, aluminum may be anodized to yield a wide range of durable aesthetic finishes which resist degradation due to everyday handling. Aluminum may be used in combination with non-metal materials, such as glass and polymer. For instance, displays of portable electronic devices may be bonded to an aluminum frame for the enclosure. The aluminum frame is often sub-divided into various electrically isolated parts such as to prevent electromagnetic interference of antenna(s) carried within the enclosure. For instance, aluminum may be used to form a structural band around the edges of the enclosure such that the display is bonded to one face, and a glass is bound to the opposing face. Furthermore, electrical insulating splits may be formed about the perimeter of the enclosure.

In order for the structural band to impart the enclosure with sufficient structural strength, robustness, rigidity, and heat and moisture-resistance throughout its lifetime, the enclosure requires a strong adhesive bond to be formed between the metal (e.g., aluminum) and the non-metal material (e.g., polymer). Indeed, these requirements are even more technically challenging to satisfy in the face of additional insulating splits (for improved antenna performance) and even smaller areas of adhesion (to minimize weight and space). Moreover, the increasing need for water-resistant enclosures demands that these adhesive bonds must not only maintain strength, but also prevent moisture leakage—even after the enclosure has been subjected to many strain cycles. Furthermore, it should be noted in the aerospace industry, conventional mechanisms for fastening metal to non-metal material such as mechanical fasteners (e.g., riveters) cannot be used in portable electronic devices due to the requirement of electrical isolation between metal parts. For example, non-metal material (e.g., polymer) is used to electrically isolate different metal parts that are attached together. Furthermore, alternatives such as chromic acid anodizing and boric-sulfuric acid anodizing yield generally poor adhesive performance. Indeed, these processes generate lightly scalloped structures which fail to provide the necessary attachment strength, water-resistance, and pull strength required for portable electronic devices to undergo consumer usage in harsh environments. Indeed, as enclosures for portable electronic devices become smaller and/or the design of these enclosures changes to a mere peripheral band of metal, the area allowed for bonding between metal and non-metal is greatly reduced. Thus, there is an increased emphasis in more robust metal to non-metal bonding. As described in greater detail herein, the embodiments described herein for attaching metal to non-metal impart at least a 50% improvement in strength over conventional mechanisms.

According to some embodiments, a composite part is described. The composite part can include a first part having a substrate formed of a first material and having an external surface across which are randomly distributed interlocking structures that extend into the substrate, where the interlocking structures include an opening characterized as having a first width at the external surface, and that leads into an undercut region that is characterized as having a second width that is greater than the first width. The composite part can further include a second part formed of a second material and including a bulk layer at the external surface and micro-portions having (i) a first portion that extends through the opening from the bulk layer, and (ii) a second portion that extends from the first portion and that completely fills and is retained within the undercut region.

As used herein, the terms anodic film, anodized film, anodic layer, anodized layer, anodic oxide coating, anodic layer, anodic oxidized layer, metal oxide layer, oxide film, oxidized layer, passivation layer, passivation film, and oxide layer can be used interchangeably and refer to any appropriate oxide layers. The oxide layers are formed on metal surfaces of a metal substrate. The metal substrate can include any of a number of suitable metals or metal alloys. In some embodiments, the metal substrate can include a steel alloy (e.g., stainless steel). The type of stainless steel can include any number of examples, such as type 316L stainless steel. In some embodiments, the metal substrate can include aluminum, and the aluminum is capable of forming an aluminum oxide when oxidized. In some embodiments, the metal substrate can include an aluminum alloy. In some embodiments, the metal substrate can include titanium or a titanium alloy. In some embodiments, the non-metal layer can include a majority of non-metal materials that are mixed or in combination with metal materials such that the non-metal layer is largely comprised of non-metal materials. In other embodiments, a part comprised of metal can also be attached to the metal part utilizing the same processes and techniques as described herein. As used herein, the terms part, layer, segment, and section can also be used interchangeably where appropriate.

These and other embodiments are discussed below with reference to FIGS. 1, 2A-2G, 3, 4-5, 6A-6B, 7A-7B, 8-11, 12A-12E, 13A-13C, 14A-14C, 15A-15B, and 16-21. However, those skilled in the art will readily appreciate that the detailed description given herein with respect to these figures is for explanatory purposes only and should not be construed as limiting.

FIG. 1 illustrates various portable devices that can be processed using the techniques as described herein. The techniques as described herein can be used to process metallic surfaces (e.g., metal oxide layers, etc.) of enclosures of portable devices for consumer usage. FIG. 1 illustrates a smartphone 102, a tablet computer 104, a smartwatch 106, and a portable computer 108. According to some embodiments, the metallic surfaces can refer to a metal substrate overlaid by a metal oxide layer. In some examples, the metal oxide layer can be formed from the metal substrate. In particular, the metal oxide layer can function as an additional protective coating to protect the metal substrate, for example, when these portable devices are dropped, scratched, chipped, or abraded.

In some examples, such as where the metal substrate includes aluminum or an aluminum alloy, the metal oxide layer can be formed over the metal substrate and can include pore structures that are formed through the metal oxide layer and can extend from an external surface of the metal oxide layer to a barrier layer that separates the metal oxide layer from the underlying metal substrate. Additionally, according to some embodiments, each of the pore structures of the metal oxide layer can be capable of receiving dye particles which can imbue the metal oxide layer with a specific color associated with the dye particles. In some examples, the metal oxide layer can include multiple, different dye colors.

According to some embodiments, a non-metal material (or bulk layer) can be attached to the external surface of the metallic surface. In particular, the multi-layer enclosures of these portable devices that include a combination of metal and non-metal materials can provide improved structural and electromagnetic interference reduction benefits to the functionality of these portable devices. In one example, these portable devices can include a wireless antenna/transceiver that is capable of receiving and transmitting data signals with other electronic devices. However, a metal surface that directly covers the wireless antenna can cause an amount of undesirable electromagnetic interference that can affect the ability of the portable device to receive and/or transmit these data signals. However, a non-metal material, such as a thermoplastic is generally non-electrically conductive (i.e., dielectric), thus can minimize the amount of electromagnetic interference that affects the portable device while still imparting the enclosure of the portable device with a sufficient amount of structural rigidity and protective qualities. In some examples, the non-metal material can also include dye particles such as to imbue the non-metal material with a specific color associated with the dye particles. In some examples, the non-metal material can include inorganic pigments and fillers in order to imbue the non-metal material with a specific color as well as enhanced mechanical strength.

As described in greater detail herein, the metallic surface can include interlocking structures that are capable of receiving and retaining the non-metal material such as to prevent the non-metal material from being forcefully pulled away and/or separated from the metal part. For example, if these portable devices 102, 104, 106, 108 are dropped or subjected to physical damage, the non-metal material may exhibit a tendency to pull away from the metal part. Beneficially, these interlocking structures can prevent the non-metal material from separating from the metal part; therefore, preserving the overall structural makeup of the enclosure. Techniques for forming the metallic surface of anyone of these portable devices 102, 104, 106, 108 are discussed below with reference to the various embodiments described with reference to FIGS. 2A-2G, 3, 4-5, 6A-6B, 7A-7B, 8-11, 12A-12E, 13A-13C, 14A-14C, 15A-15B, and 16-21.

Etching for Bonding Non-Metal Material to Metal Parts

Figure 2A:
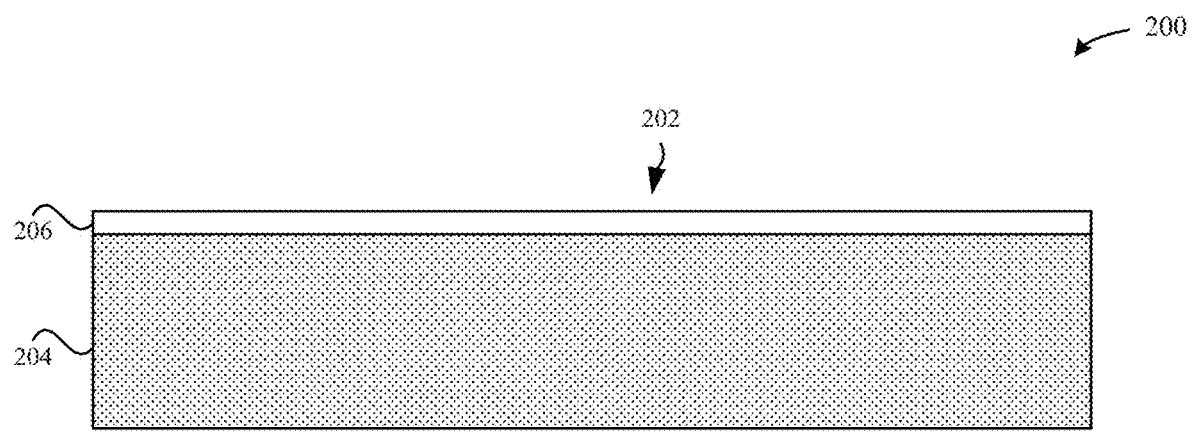
FIGS. 2A-2G illustrate cross-sectional views of a process for forming interlocking structures at an external surface of a metal part, in accordance with some embodiments.

FIGS. 2A-2F illustrate cross-sectional views of a metal part undergoing a process for forming interlocking structures at an external surface of the metal part, in accordance with some embodiments. FIG. 2A illustrates a metal part 200 prior to undergoing the process for forming the interlocking structures at an external surface 202 of the metal part 200. In some embodiments, the metal part 200 can have any thickness that is suitable for the subsequent etching process, whereby the external surface is exposed to an etching solution. In some embodiments, the metal part 200 has a near net shape of a final part, such as the enclosures of the portable devices 102, 104, 106, and 108. The external surface 202 can correspond to an attachment surface or interface for attaching a non-metal layer to the metal part.

According to some embodiments, the metal part 200 illustrated in FIG. 2A represents the metal part 200 subsequent to a surface treatment process, such as a non-electrolytic passivation process. In particular, the metal part 200 can include a metal oxide layer 206 that is disposed over the metal substrate 204 as a result of the non-electrolytic passivation process. In some examples, a surface of the metal substrate 204 is cleaned prior to undergoing the passivation process. In some examples, during the non-electrolytic passivation process, the metal substrate 204 can be oxidized to form a native metal oxide layer through a spontaneous process by exposing the metal substrate 204 to air or moisture. For example, the metal substrate 204 can include a steel alloy (e.g., stainless steel). In particular, stainless steel can include about 72% iron and between about 16%-18% of chromium. The chromium alloying element present in stainless steel can react with oxygen and lend the metal substrate 204 susceptible to undergo the non-electrolytic passivation process such as to form the metal oxide layer 206 (e.g., chromium oxide) that is disposed over the metal substrate 204. In some examples, the metal oxide layer 206 can include a chromium oxide film, where the chromium oxide film can also be referred to as a passivation layer that is formed over the metal substrate 204 that includes stainless steel. In some examples, the chromium oxide film can include $Cr_2O_3$ oxide. Additionally, a porous oxide that is formed outside of the passivation layer can include a Ni/Fe oxide.

According to some examples, the metal substrate 204 is a three-dimensional structure having a height, width, and depth, and the metal substrate 204 can have any type of geometry that is suitable for forming the metal oxide layer 206 and for attaching a non-metal layer to the metal part 200. In some examples, the geometry of the metal substrate 204 can include rectangular, polygonal, circular, beveled edges, angular edges, elliptical, etc. In some examples, the texture of the metal substrate can be generally flat or a non-even surface.

In other examples, where the metal oxide layer 206 includes aluminum or an aluminum alloy, the metal oxide layer 206 can be formed through an electrolytic anodizing process. In some embodiments, a portion of the metal substrate 204 is converted or consumed by the conversion to the metal oxide layer 206. In other examples, the metal oxide layer 206 can be formed through any suitable anodization process.

According to some examples, the metal oxide layer 206 can have a thickness between about 1 nanometer to several hundred nanometers. In some examples, the thickness is between about 3 nanometers to about 500 nanometers. In some examples, the thickness of the metal oxide layer 206 is between about 10 nanometers to about 100 nanometers. The thickness of the metal oxide layer 206 can be controlled by adjusting for the amount of time that the metal substrate 204 is exposed to the passivation process. According to some embodiments, where the metal oxide layer 206 includes aluminum or an aluminum alloy, the metal oxide layer 206 can include pore structures that are defined by pore walls characterized as having generally columnar shapes that are elongated in a direction generally perpendicular to a central plane of the external surface 202 of the metal part 200.

Figure 2B:
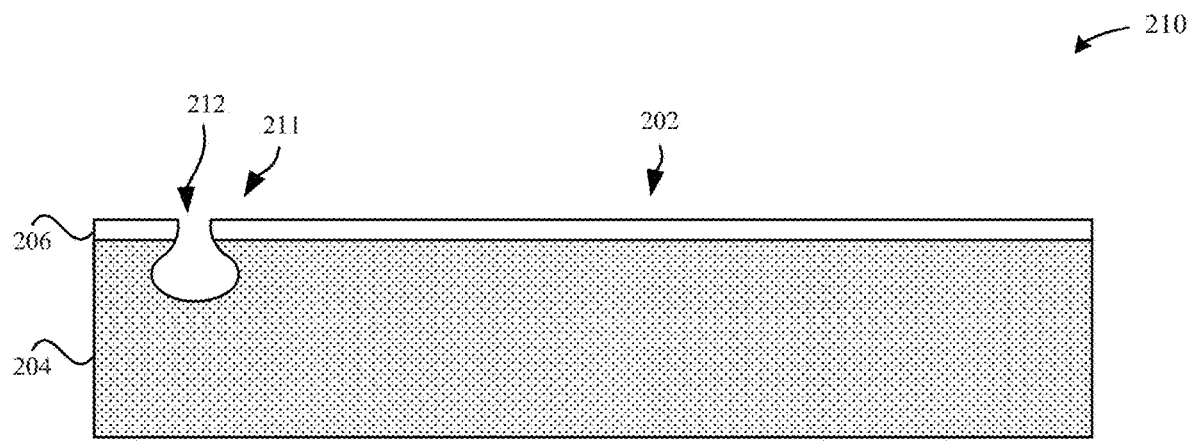

FIG. 2B illustrates a cross-sectional view of a metal part 210 subsequent to undergoing the process for forming a first interlocking structure 212 at the external surface 202 of the metal part 210. According to some embodiments, the process for forming the first interlocking structure 212 can involve etching the metal part 200, such as by exposing the metal part 200 to an etching solution. According to some examples, the etching solution can include ferric chloride ($FeCl_3$). In some examples, the concentration of $FeCl_3$ present in the etching solution is between about 150 g/L to about 250 g/L. In particular, when the metal part 210 is exposed to the etching solution during a first cycle, the etching solution can cause a first interlocking structure 212 to be formed at the external surface 202 of the metal part 210. In some instances, the first interlocking structure 212 can refer to an etched structure having multi-angled side surfaces or multi-cracks.

In some examples, the first interlocking structure 212 is formed at a reactive site—a first region 211 of the external surface 202 where there is weakness or a defect in the metal oxide layer 206. In some examples, the etching solution can cause a portion of the metal oxide layer 206 corresponding to a location of the first interlocking structure 212 to be removed to form the first interlocking structure 212. It is noted that in some examples, the first interlocking structure 212 can refer to a number of interlocking structures formed at multiple weakened regions of the metal oxide layer 206, as described in greater detail with reference to FIG. 2G. For instance, the chloride present in $FeCl_3$ can interact with metal oxides present in the metal oxide layer 206, thus dissolving the metal oxide bonds and exposing the metal substrate 204.

According to some examples, each etching cycle of the etching process has a duration between about 30 seconds to about 300 seconds. In other examples, each etching cycle is about 60 to about 150 seconds in duration. In particular, adjusting the duration of the etching cycle can directly affect the size (e.g., diameter, width, etc.) of each of the interlocking structures that are formed at the external surface 202. Additionally, the chemistry of the etching solution can also directly impact the size of each of the interlocking structures. For instance, a greater concentration of the etching solution (e.g., $FeCl_3$) can directly contribute to increasing the size of each of the interlocking structures.

Figure 2C:
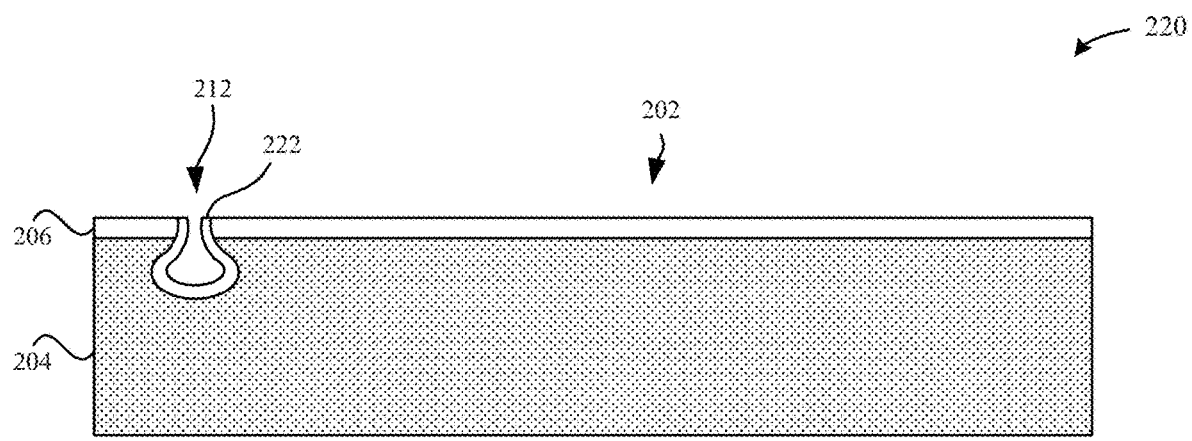

As illustrated in FIG. 2C, the metal part 220 can form a passivation oxide layer 222 formed over the first interlocking structure 212. Subsequent to completing the first etching cycle, the metal part 210 can be removed from the etching solution and exposed to oxygen in the air in order to promote formation of a passivation oxide layer over the exposed metal substrate 204 corresponding to the first interlocking structure 212. In some examples, the metal part 210 can be exposed to oxygen for a duration of about 10 seconds. In other examples, the duration of exposure is between about 1 minute to about 5 minutes. Additionally, the external surface 202 of the metal part 210 can be cleaned so as to remove any liquid or contaminants that may be present to further promote formation of a passivation oxide layer over the exposed metal substrate 204 of the first interlocking structure 212. For example, the external surface 202 can be cleaned and rinsed with tap water or deionized water in order to remove any remnants of the $FeCl_3$. Additionally, reverse osmosis water can also be used to remove any remnants of the FeCl$_3$. In some instances, the cleaning of the external surface 202 may be preferable in order to inhibit or stop the growth of the first interlocking structure 212 so as to promote the formation and growth of additional interlocking structures at other regions of the external surface 202. Additionally, the external surface 202 can be cleaned after each etching cycle (i.e., subsequent to the formation of each interlocking structure) in order to promote growth and formation at new regions (i.e., non-etched regions) of the external surface 202.

In some examples, the passivation oxide layer 222 is about 10 nanometers. According to some embodiments, the passivation oxide layer 222 grow to a thickness that is sufficient to seal in the metal substrate 204 and prevent contaminants from reaching the metal substrate 204. Additionally, because the passivation oxide layer 222 seals the metal substrate 204, the passivation oxide layer 222 can act as a barrier to prevent metal corrosion of the underlying metal substrate 204. In some examples, the passivation oxide layer 222 can be referred to as a repassivation layer that is formed through a repassivation process. During the repassivation process, the passivation oxide layer 222 grows over the first region of the metal substrate 204 having the defect. Beneficially, forming the repassivation layer over this first region can make it more difficult to initiate or form another interlocking structure at the same region during a subsequent etching cycle. Beneficially, in this manner, when the metal part 220 is re-exposed to the etching solution during a subsequent etching cycle, the etching solution can cause interlocking structures to be formed in other regions distinct from the first region 211 as the first region 211 is no longer the most chemically susceptible to being etched. Although in some embodiments, re-exposure of the metal part 220 to the etching solution can form supplementary interlocking structures at the first region 211. However, these supplementary interlocking structures will have a size that is considerably less than the size of the first interlocking structure 212 and generally do not affect the structural integrity of the first interlocking structure 212.

Figure 2D:
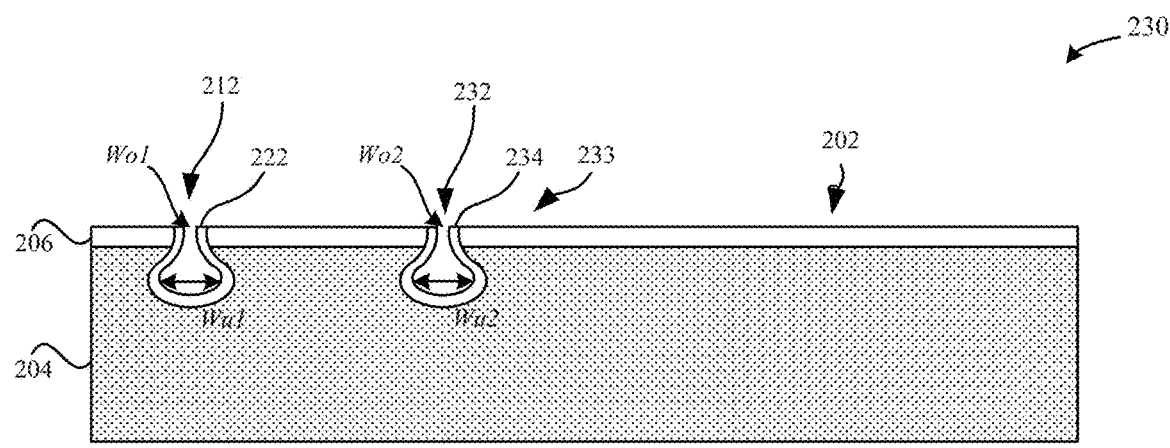

Subsequent to forming the passivation oxide layer 222 over the first interlocking structure 212, the metal part 220 is exposed to a subsequent etching process (e.g., second etching cycle), as described with reference to FIG. 2D. FIG. 2D illustrates a cross-sectional view of a metal part 230 subsequent to undergoing the subsequent etching process where the metal part 230 is exposed again to the etching solution. As the passivation oxide layer 222 is formed over the first interlocking structure 212, the first interlocking structure 212 is far less susceptible to growing a subsequent interlocking structure at the first region 211 or increasing the size of the existing first interlocking structure 212. In some examples, the reduced susceptibility can be attributed to the passivation oxide layer 222 that is formed over the first interlocking structure 212 can be more resistant to corrosion. In some examples, the reduced susceptibility can be attributed to the decrease in electrochemical potential at the first region, as will be described in greater detail with reference to FIG. 2F. Instead the etching solution can cause a second interlocking structure 232 to form at a second region 233 of the external surface 202. In some examples, the second interlocking structure 232 can refer to a number of interlocking structures formed at multiple weakened regions of the metal oxide layer 206, as described in greater detail with reference to FIG. 2G. Although in some examples, it may be preferable to further grow the existing first interlocking structure 212 when re-exposing the metal part 220 to the etching solution by adding additional voids onto the first interlocking structure 212. In some examples, secondary/supplementary interlocking structures can grow and be formed from the first interlocking structure 212. However, it should be noted that the structural of the first interlocking structure 212 generally remains intact in this scenario.

In some examples, the etching solution etches away the second region 233 that corresponds to a region having a defect or a weakness in the metal oxide layer 206. For example, the defect in the region can refer to a deficiency in the amount of chromium present in the metal oxide layer 206. In another example, the defect in the region can refer to a highly stressed passivation oxide layer—e.g., 222—that is formed over a grain boundary. In another example, the defect in the region can refer to a highly stressed edge. According to some embodiments, the metal oxide layer 206 can include several reactive sites (e.g., conducive to being etched) that are capable of forming interlocking structures. As described herein with reference to FIG. 2G, a reactive site—e.g., first region 211—can be conducive to being etched to form interlocking structures 212, 232. Additionally, a reactive site—e.g., second region 233—can be conducive to being etched to form interlocking structures 242, 244. Moreover, a reactive site—e.g., a third region 255—can be conducive to being etched to form interlocking structure 246. Subsequent to the second etching cycle, the metal part 230 is removed from the etching solution so that the metal part 230 is once again exposed to air and the second interlocking structure 232 to undergo a non-electrolytic passivation process. As a result of the non-electrolytic passivation process, a passivation oxide layer 234 is formed over the second interlocking structure 232.

According to some embodiments, the overall size of the interlocking structures—e.g., 212, 232—can directly affect their respective pull strength (e.g., attachment strength between the metal part and the non-metal layer). In some instances, the duration in which the metal part is exposed to the etching cycle (e.g., first etching cycle, second etching cycle, etc.) can direct affect the overall size of the interlocking structure. For example, in one scenario, exposing the metal part 200 to a first etching cycle that is about 45 seconds in duration can cause the first interlocking structure 212 to have a greater pull strength than the second interlocking structure 232 which is exposed to a second etching cycle that is about 30 seconds in duration.

According to some embodiments, the amount of penetration depth into the metal part—e.g., 230—can be considered a property of an overall size of each respective interlocking structure—e.g., 212, 232. In some examples, the interlocking structures 212, 232 can have a depth of penetration into the metal part 230 that is between about 25 micrometers to about 200 micrometers. It should be noted that the overall depth of penetration of each of these interlocking structures can be directly attributed to the duration of the etching cycle responsible for forming the interlocking structures.

According to some embodiments, the first interlocking structure 212 of the metal part 230 can be capable of receiving an attachment feature (or micro-portion) of the non-metal material, as described in greater detail with reference to FIG. 2F. According to some embodiments, the first interlocking structure 212 of the metal part 230 can be characterized as having an opening (Wo1) that leads into an undercut region (Wu1). In some examples, the first interlocking structure 212 can be characterized as a recessed structure that extends into the metal substrate 204, and the undercut region has an undercut geometry. The size of the opening (Wo1) can be characterized as having a width or diameter that is less than a size of the undercut region (Wu1). In some examples, the ratio of the width of the opening (Wo1) to the width of the undercut region (Wu1) is 0.5:1 and higher. In some examples, the ratio is at least 0.5:1 to about 1:6. However, it should be noted that the widths of the opening and the undercut region are of any sufficient size to capture and retain a portion of the non-metal material that is subsequent disposed onto the metal part so long as the size of the opening is less than the size of the undercut region.

As further illustrated in FIG. 2D, the second interlocking structure 232 of the metal part 230 can also be capable of receiving an attachment feature of the non-metal material. In some examples, the first and second interlocking structures 212, 232 can have a similar overall size (e.g., depth of penetration, width, etc.) as a result of being exposed to respective etching cycles that are of equivalent duration.

Figure 2E:
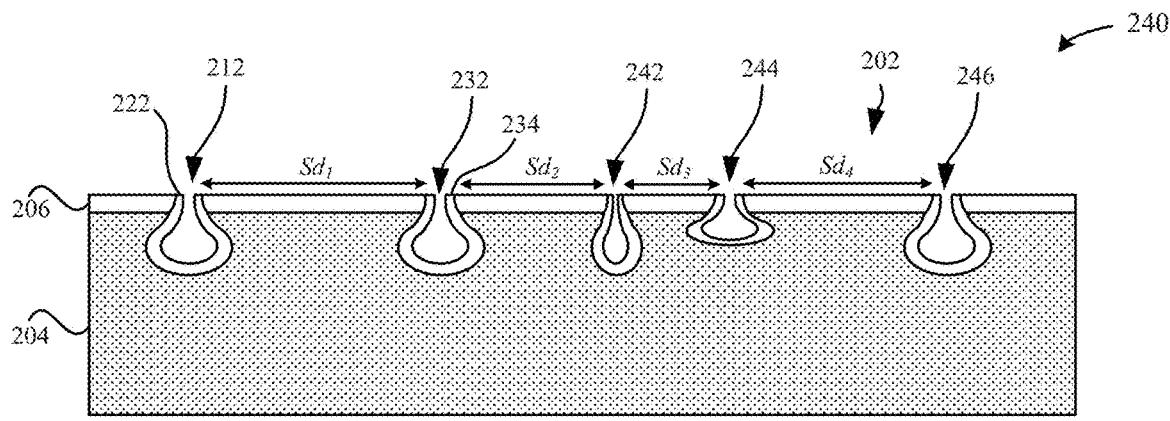

Subsequently, the metal part 230 can be subjected to additional etching cycles as desired to form additional interlocking structures at different regions of the external surface 202. Subsequent to exposing each iteration of the metal part to the etching solution, the metal part 230 can be removed from the etching solution, rinsed of the etching solution, and exposed to air in order to form a passivation oxide layer in the recently formed interlocking structure. For example, as illustrated in FIG. 2E, the metal part 230 can be further subjected to additional processes to form additional interlocking structures. As illustrated in FIG. 2E, the metal part 240 can include additional interlocking structures—e.g., third interlocking structure 242, fourth interlocking structure 244, and fifth interlocking structure 246. In some embodiments, any single etching cycle can produce several or a large number of interlocking structures at a region of the metal oxide layer 206 having defects, as will be described in more detail with reference to FIG. 2G. When these additional interlocking structures are exposed to air and rinsed of the etching solution, a passivation oxide layer can form over the exposed portions of the metal substrate 204 corresponding to these interlocking structures. It should be noted that the passivation oxide layer that is formed over the exposed portion is of at least similar quality to the metal oxide layer 206. For example, the passivation oxide layer of each interlocking structures can be of substantially the same thickness as the previously formed metal oxide layer 206 that corresponds to the position of the interlocking structure. In some instances, the respective passivation oxide layer formed over the interlocking structures can protect the underlying metal substrate 204 from exposure to contaminants. Additionally, in some examples, the respective passivation oxide layer assumes a shape (e.g., boundary) that generally corresponds to the shape of the corresponding interlocking structure. It should also be noted that the respective passivation oxide layer of the one or more previously formed interlocking structures 212, 232 can further grow/increase in thickness when the metal part—e.g., the metal part 230—is removed of the etching solution and exposed to air.

As illustrated in FIG. 2E, openings of the interlocking structures—e.g., 212, 232, 242, 244, and 246 can be separated from each other by a separation distance that is greater than a minimal separation distance. In some examples, the minimal separation distance is in the order of tens to hundreds of micrometers such that openings of neighboring interlocking structures do not overlap one another and result in destabilization of respective etched walls of the neighboring interlocking structures. In some examples, the minimal separation distance corresponds to etched walls that define the undercut region being generally intact. For example, referring to FIG. 2E, openings of the interlocking structures 242 and 244 are separated by a separation distance $(Sd_3)$ such that walls that define the undercut regions of each of the respective interlocking structures are not destabilized by the presence of the neighboring interlocking structures. In this manner, the shape and size of the undercut regions is generally maintained. In some examples, any number of the interlocking structures—e.g., 212, 232, 242, 244, and 246 can be discretely and independently formed from each other. Additionally, FIG. 2E illustrates that the separation distance between openings of the interlocking structures—e.g., 212, 232, 242, 244, and 246 can be generally varied, as the interlocking structures can form where there are defects in the metal oxide layer 206. For instance, at least one of the interlocking structures—e.g., 212, 232, 242, 244, or 246 are randomly distributed and randomly formed throughout the external surface 202. As previously described herein, any one of the interlocking structures can be formed in regions of the metal oxide layer 206 having defects or weaknesses. However, in other examples, the separation distance between openings of the interlocking structures can be generally uniform. In yet other examples, the separation distance between openings of these interlocking structures—e.g., 212, 232, 242, 244, and 246 can be individually adjusted and controlled, such as by masking off regions of the external surface 202 from being etched, as will be described in more detail with reference to FIG. 9. In other examples, the respective sizes of each of the interlocking structures—e.g., 212, 232, 242, 244, and 246 can be random.

In some embodiments, the metal part 240 illustrated in FIG. 2E exhibits an amount of moderate etching, whereby between about 25% to about 65% of the external surface 202 of the metal part 240 is etched with the interlocking structures. In other examples, the interlocking structures cover between about 40% to about 50% of the external surface. In some examples, the openings of these interlocking structures cover between about 40% to about 60% of the external surface 202. By instituting moderate etching of the external surface, a respective pull strength for each interlocking structure can be optimal. Beneficially, the metal part 240 characterized as having a moderately etched external surface imparts a strong amount of adhesion between the metal part 240 and a non-metal layer (e.g., polymeric layer, etc.) as illustrated in FIG. 2F.

Figure 2F:
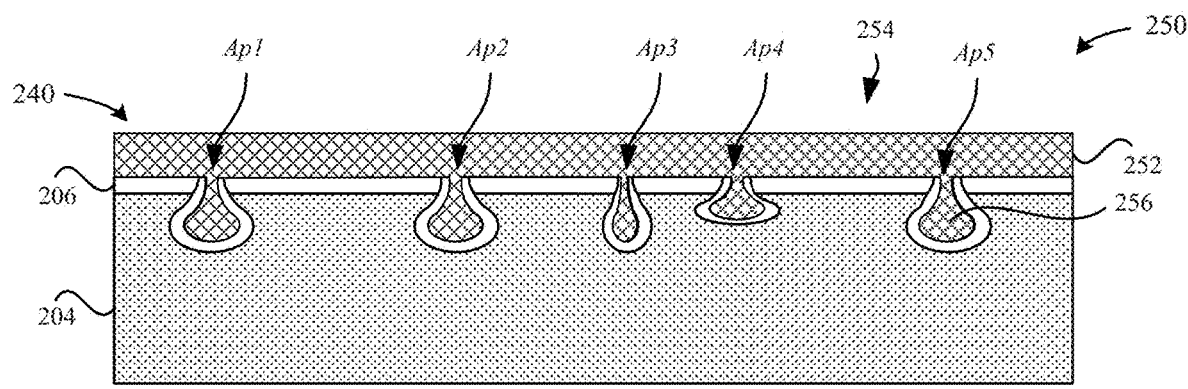

FIG. 2F illustrates a cross-sectional view of a multi-layer part 250 (e.g., composite part) having a non-metal layer 252 that is disposed over the metal part 240, in accordance with some embodiments. In some embodiments, the non-metal layer 252 is bonded or attached to the metal part 240. In some examples, the non-metal layer 252 can be characterized as a bulk layer having protruding features. For example, the non-metal layer 252 can refer to a polymer material, such as polybutylene terephthalate (PBT), polyethylene terephthalate ("PET"), polyaryletherketone ("PAEK"), or polyether ether ketone ("PEEK") that while in a melted state can be allowed to flow into the interlocking structures—e.g., 212, 232, 242, 244, 246—of the metal part 240. In some examples, the non-metal layer 252 can include a non-metal material in addition to other materials (e.g., metal, non-metal, etc.) so long as the non-metal layer 252 is sufficient and capable of being received by the interlocking structures. In some examples, the non-metal layer 252 can have any amount of viscosity or surface tension that is sufficient to attach to the external surface 202 of the metal part 240. When the polymer material flows into these interlocking structures, the polymer can penetrate into the undercut regions (Wu) of these interlocking structures and fill in the undercut regions (Wu) as well as multi-angle side surfaces of the walls that define these undercut regions (Wu). After flowing into these undercut regions (Wu), the polymer material can be allowed to harden into protruding portions or attachment features 256. Thus, the polymer material can be allowed to transform from the melted state into a solid state. Upon changing into the solid state, the polymer material can enable the non-metal layer 252 to physically attach or bond to the metal part 240 in order to form the multi-layer part 250. As illustrated in FIG. 2F, the non-metal layer 252 in the solid state can be disposed so that it is relatively flush with the external surface 202 of the metal part 240. The multi-layer part 250 that is formed as a result can have an external surface 254 that can correspond to an external surface of the portable devices—e.g., 102, 104, 106, and 108.

As illustrated in FIG. 2F, the interlocking structures—e.g., 212, 232, 242, 244, 246—of the metal part 240 when receiving and attaching to the attachment features 256 of the non-metal layer 252 can define anchor portions—e.g., Ap1-5 that are capable of both capturing and retaining the non-metal layer 252 to the metal part 240. In some examples, a hallmark of a multi-layer part 250 having interlocking structures having undercut regions (Wu) makes it considerably more difficult to pull or separate the non-metal layer 252 from the metal part 240 relative to a metal part having staggered interlocking structures that is formed through a conventional process.

Figure 2G:
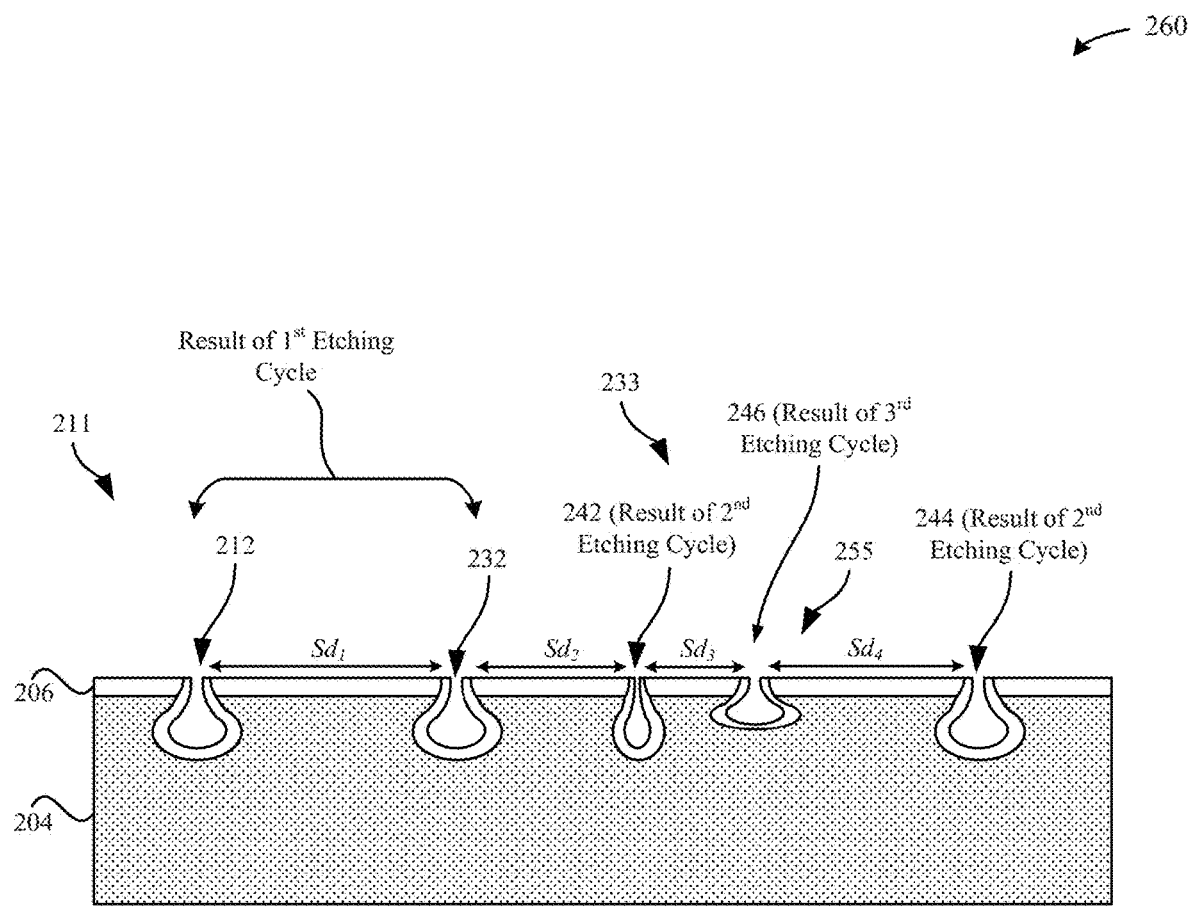

As illustrated in FIG. 2G, multiple interlocking structures can be formed at the metal oxide layer 206 as a result of a single etching cycle. In particular, a single etching cycle can produce a large number of interlocking structures at a region of the metal oxide layer 206 having defects. For example, FIG. 2G illustrates that interlocking structures—e.g., 212, 232—can be formed at a first region 211 of the metal oxide layer 206 subsequent to the first etching cycle. Additionally, FIG. 2G illustrates that interlocking structures—e.g., 242, 244—can be formed at a second region 233 of the metal oxide layer 206 subsequent to the second etching cycle. Furthermore, FIG. 2G illustrates that interlocking structure—e.g., 246 can be formed at a third region 255 of the metal oxide layer 206 subsequent to the third etching cycle. In some examples, the interlocking structure 246 can be formed between the interlocking structures—e.g., 242, 244—of the second region 233. It should be noted that although any number of interlocking structures can be formed at a region of the metal oxide layer 206 having defects subsequent to an etching cycle, the number of interlocking structures that are formed as a result of a single etching cycle do not cover in excess of a large portion of the total surface area (e.g., >65%) of the metal oxide layer 206. In particular, subsequently etching cycles can be required to form additional interlocking structures that are sufficient to cover the external surface (e.g., 25% to about 65%) of the metal oxide layer 206 without sacrificing the structural rigidity of the metal oxide layer 206. In particular, the subsequent etching cycles can form as many additional interlocking structures as possible to cover the external surface without causing each interlocking structure to grow into its respective neighboring interlocking structure and cause destabilization of the walls of the neighboring interlocking structures.

According to some embodiments, the etching solution can include one or more different types of chemicals. In particular, in order to etch the metal part 200 can require the steps of weakening or breaking down the passivation oxide layer that is formed on the external surface 202 of the metal part 200. Firstly, the etching solution can include chloride (Cl—) in order to weaken the passivation oxide layer that is formed on the external surface 202 of the metal part 200. The chloride in the etching solution can be provided by either ferric chloride ($FeCl_3$) or hydrochloric acid (HCl) or any other salts and acids with Cl as their anion. In some examples, the ferric ions can oxidize the metal part 200 to promote formation of the interlocking structures. For example, the higher chromium concentration present in the stainless steel (e.g., usually greater than 13%) can lead to the formation of the passivation oxide layer. In particular, the presence of the passivation oxide layer can make it difficult to etch the stainless steel. Additionally, as the stainless steel has a high electrochemical potential, there may be few chemicals (i.e., oxidants) that are capable of etching the passivation oxide layer in order to promote the formation of etched interlocking structures at the external surface 202 of the metal part 200. Secondly, once the passivation oxide layer is sufficiently weakened or broken down with chloride (Cl—) at a high temperature (e.g., between about 70° C. to about 85° C.), then the underlying metal substrate 204 can be exposed to the etching solution. In some examples, the true electrochemical potential of the stainless steel is around −0.46 V (without any passivation). In this case, any oxidants having an electrochemical potential that is higher than −0.46 V can be used as a cathode to form an electrochemical cell (or battery) with the stainless steel that can be used as an anode in order to cause the etching to occur.

In some examples, etching of the passivation oxide layer can occur through an electrolytic process. For example, the electrolytic etching solution can include at least one of HCl, $H_2SO_4$, $HNO_3$, or $H_3PO_4$. In some examples, etching of the passivation oxide layer can occur through electroless process. In some examples, the electroless etching solution can include at least one of HCl, FeCl3, $H_2O_2$, $CuCl_2$, $H_2SO_4$, HF, or $HNO_3$. In particular, the use of fluoride can dissolve the passivation oxide layer. In some examples, the oxidants having an electrochemical potential that is between about 0 V to about 2.4 V. Accordingly, any one of these aforementioned oxidants can be capable of being used as a cathode in order to form the electrochemical cell with the anode of the stainless steel.

According to some examples, the etching solution can include a concentration of at least ≥150 g/L of $FeCl_3$ in order to promote formation of multiple interlocking structures—e.g., 212, 232, 242, 244, 246. Moreover, in order to promote formation of multiple interlocking structures, the temperature of the etching solution can be between about 50° C. to about 90° C. Furthermore, as previously described herein, the overall size (e.g., penetration depth, width, etc.) of each of the multiple interlocking structures can be directly dependent upon the duration of each respective etching cycle. Thus, it is noted that is preferable that these factors should be carefully monitored during each of the etching cycles in order to carefully control the formation and growth of each of the interlocking structures. For instance, if the concentration of the etching solution is too high (e.g., >300 g/L), then the resulting interlocking structures will have smooth wall surfaces (i.e., absence of multi-cracks). Consequently, the lack of surface roughness along walls that define the undercut regions (Wu) of these interlocking structures can significantly compromise the amount of adhesion between the non-metal layer 252 and the metal part—e.g., 240. Additionally, it should be noted that if the concentration of $FeCl_3$ is too high can lead to forming too many interlocking structures such that neighboring interlocking structures will grow into each other and lead to destabilization of the etched walls. Additionally, if the duration time of an etching cycle is too long (e.g., >150 seconds), then the interlocking structure can grow to an overall size (e.g., >150 micrometers) that is no longer as effective or useful for capturing and retaining the non-metal layer 252. Consequently, the walls that define the interlocking structure 212 are no longer clearly separated from each other and the interlocking structures is characterized instead as a staggered interlocking structure.

The staggered interlocking structure contrasts from an interlocking structure in that the staggered interlocking structure includes an opening having a size (e.g., width, etc.) that is greater than a capture region which is disposed below the opening. In some examples, the opening of the staggered interlocking structure is greater than the capture region because over-etching of the external surface etches away a majority of the material of the metal part closer towards the external surface rather than away from the external surface. Indeed, staggered interlocking structures generally have a depth of penetration of greater than about 150 micrometers and are generally symptomatic of etching cycles in excess of e.g., >150 seconds. Furthermore, the over-etching of the external surface can be symptomatic of a metal part that is exposed to an etching process for a single cycle for a long duration of time (e.g., >150 seconds). Consequently, multiple voids are formed onto each other at the same region of the external surface to form a staggered interlocking structure.

Additionally, the etching solution can include an acid, such as hydrochloric acid (HCl) or hydrochloric acid with sulfuric acid that can promote growth of the first interlocking structure 212 after it has been initially formed. In some embodiments, the first interlocking structure 212 can grow to have a size and shape that is sufficient for capturing and retaining a portion of the non-metal layer 252. In particular, the presence of the acid can actually smoothen the walls, thereby reducing the formation of multi-cracks or multi-angle side surfaces along the walls that define the openings and undercut regions of the first interlocking structure 212. Generally, the interlocking structures stop growing when the acid present at the external surface 202 is removed via a cleaning process.

Figure 3:
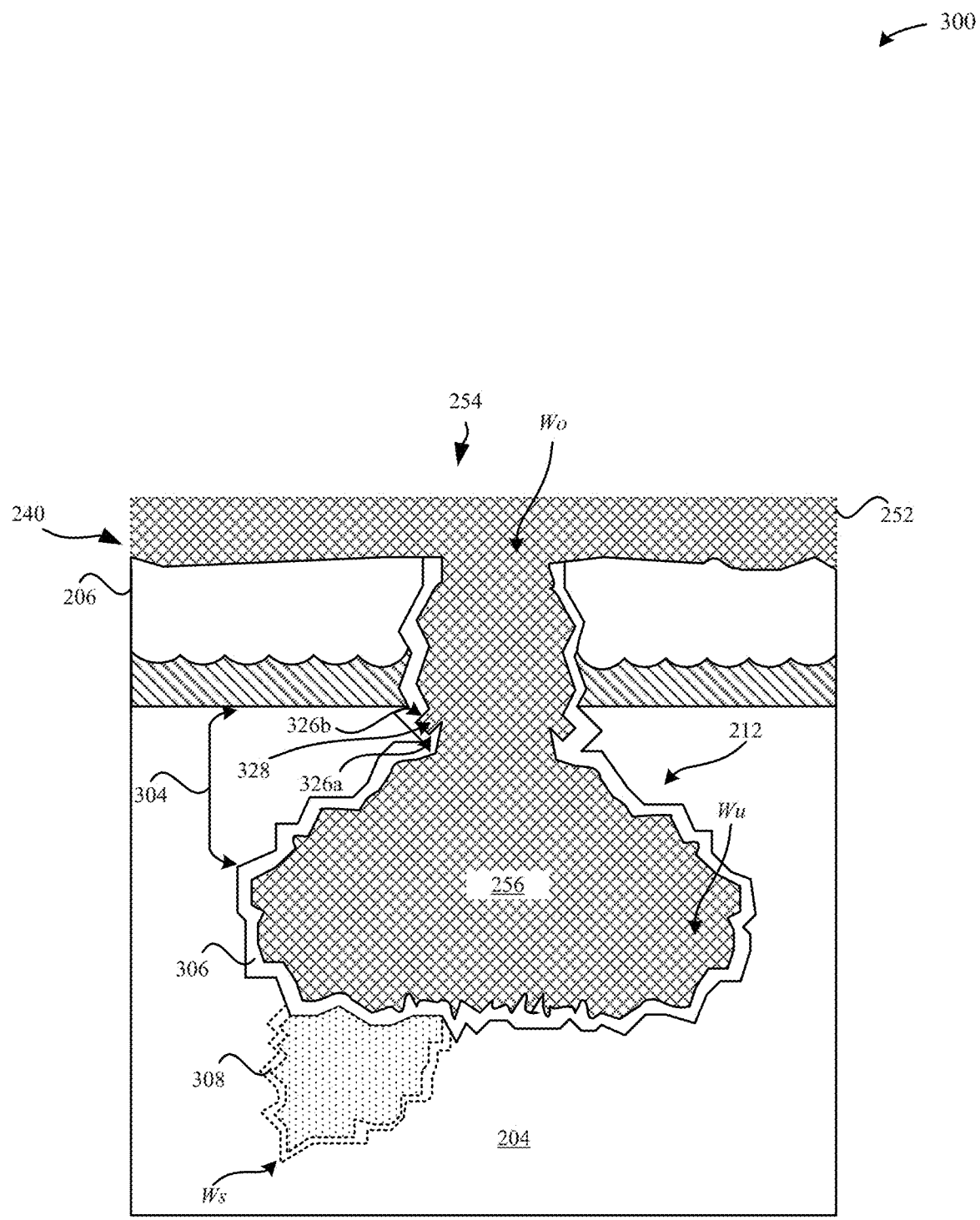
FIG. 3 illustrates a cross-sectional view of a metal part having an interlocking structure, in accordance with some embodiments.

FIG. 3 illustrates a magnified cross-sectional view 300 of a multi-layer part—e.g., the multi-layer part 250, in accordance with some embodiments. It should be noted that during each etching cycle, the etching solution generally affects only the portions of the metal oxide layer 206 that are susceptible to etching (e.g., has a deficiency in chromium, highly stressed passive film over a grain boundary, highly stressed edge, etc.). FIG. 3 illustrates that the multi-layer part 250 can include an interlocking structure 212 that extends from the external surface 202 and towards the metal substrate 204. The interlocking structure 212 can extend into portions of the metal substrate 204, thus exposing portions of the metal substrate 204 to air subsequent to the etching cycle. Subsequently, the exposed portions of the metal substrate 204 can be oxidized to form a passivation oxidation layer 306, that can be generally similar in quality to the metal oxide layer 206. In some examples, the passivation oxidation layer 306 can assume a shape that generally corresponds to the shape of the interlocking structure 212.

In some embodiments, the interlocking structure 212 can include an opening (Wo) that leads into an undercut region (Wu), which is capable of capturing and retaining the attachment feature 256 of the non-metal layer 252. The undercut region (Wu) can also be defined by overhangs 304, having a generally curved shape or triangular shape and that separates the opening (Wo) from the undercut region (Wu). In some examples, the opening (Wo) and the undercut region (Wu) are defined by walls having multi-angle side surfaces 326a-b (or multi-cracks). In particular, the multi-angle side surfaces 326a-b can uniquely define multiple pockets that can be filled with the non-metal layer 252 while in a melted state in order to promote a greater amount of adhesion strength between the non-metal layer 252 and the metal part 240. In particular, because the material of the non-metal layer 252 fills in the pockets defined by the multi-angle side surfaces 326a-b, there may be no air gaps or spacing that separates the attachment features 256 from the interlocking structure 212. Therefore, the material of the non-metal layer 252 can be flush against the multi-angle side surfaces 326a-b. Additionally, it is noted that the multi-angle side surfaces 326a-b can define a leak inhibition path 328 that can inhibit moisture from reaching the metal substrate 204. In particular, because the multi-angle side surfaces 326a-b define multiple pockets that can be filled with the non-metal layer 252, the leak inhibition path 328 is characterized as having a non-uniform width and having tortuous, sharp turns, twists, dramatic alterations in angle, and sharp junctions that can inhibit moisture that enters by way of the opening (Wo) from bypassing the undercut region (Wu) to reach the metal substrates 204. In some examples, the leak inhibition path 328 is characterized as being a serpentine path that prevents moisture from reaching the metal substrate 204.

According to some embodiments, one or more secondary interlocking structures (Ws) can be formed from the interlocking structure 212 subsequent to an etching cycle. In some examples, the secondary interlocking structure (Ws) has a size that is smaller than the interlocking structure 212. In some examples, the secondary interlocking structure (Ws) also is characterized as having multi-angle side surfaces that define a serpentine path that prevents moisture from reaching the metal substrate 204. In addition, the secondary interlocking structure (Ws) can be formed by exposing an underlying region of the metal substrate 204 that is at least one of below, offset, or adjacent to interlocking structure 212 in order to further extend the total area of the undercut region (Wu). Subsequent to forming this secondary interlocking structure, a secondary passivation oxide layer 308 can also be formed to seal the exposed portions metal substrate 204 and prevent contaminants from reaching the metal substrate 204. In some examples, these secondary interlocking structures (Ws) can be formed by re-exposing the metal part—e.g., the metal part 240—to the etching solution. For instance, defects in the passivation oxidation layer 306 can render the interlocking structure 212 still susceptible to being further etched. Although it may be more difficult to form the secondary interlocking structure (Ws) onto a previously formed interlocking structure 212 relative to forming another interlocking structure—e.g., the interlocking structure 232—in a different region. In some examples, it may be preferable to grow into the existing first interlocking structure 212. However, it should be noted that the shape of the first interlocking structure 212 generally remains intact and the multi-angle side surfaces 326a-b are also generally intact in this scenario.

FIGS. 4-5 illustrate different perspective views of a part 400 of an enclosure having multiple interlocking structures that are disposed at an external surface of the part 400, in accordance with some embodiments. FIG. 4 illustrates a top view of the part 400 having interlocking structures 410a-c that are etched into multiple regions of an external surface 404 of the part 400. In some examples, these interlocking structures 410a-c can be characterized as being independent or discretely formed from each other such that each interlocking structure 410 does not physically interfere with a structure of another. In some examples, each of the openings of these interlocking structures 410*a-c* can be separated by a separation distance that is greater than a minimal separation distance such that adjacent interlocking structures 410 do not have walls that overlap or destabilize with each other (e.g., does not affect shape or size of the undercut region). In some examples, at least of the interlocking structures 410*a, b, c* are randomly distributed and randomly formed throughout the external surface 404.

In some instances, each of the interlocking structures 410*a-c* is formed as a result of an individual etching cycle. In some examples, the etching cycle has a duration time of between about 30 seconds to about 300 seconds. Subsequent to the formation of each interlocking structure, the part 400 can be removed from an etching solution, cleaned, and re-exposed to the etching solution such that another defined interlocking region can be formed at a new region (i.e., un-etched region). As a result, multiple interlocking structures 410*a-c* are formed at multiple regions of the external surface 404. In some examples, the part 400 can be characterized as having a moderately-etched surface, which comprises interlocking structures 410 that cover between about 25% to about 65% of the total surface area of the external surface 404. In other examples, the part 400 can be characterized as having a lower pit density value than a pit density value of an overly-etched part.

In contrast to the part 400 having the moderately-etched surface, conventional processes can yield overly-etched parts characterized as having staggered interlocking structures. The overly-etched parts are characterized as having between about 80% to about 100% of a total surface area of the external surface covered with voids that make up the staggered interlocking structures. In particular, the staggered interlocking structure can include multiple individual voids that are etched into the external surface as a result of a single etching cycle where these multiple individual voids grow onto/overlap with each other. In other words, there is a lack of separation distance between each of these voids. Additionally, the staggered interlocking structures of the overly-etched parts have a penetration depth of between about 150 to about 400 micrometers.

FIG. 5 illustrates a perspective cross-sectional view of the part 400 as indicated by the reference line 407 in FIG. 5. As illustrated in FIG. 5, the part 400 has multiple interlocking structures 410*a-c* having well-defined undercut regions (Wu). In other words, the well-defined undercut region of an interlocking structure 410 is characterized as having a size (Wu) that is greater than an opening (Wo) of the same interlocking structure 410. In other words, the ratio in size between the opening (Wo) and the undercut region (Wu) is 0.5:1 or greater. In some examples, the ratio is between about 0.5:1 to about 1:6. Beneficially, the interlocking structure 410 has significantly increased pull strength relative to a staggered interlocking structure.

In contrast, the overly-etched part has a staggered interlocking structure with a size (e.g., width, diameter) that is at least equal to or greater than a size of a capture region. In other words, the ratio in size between the opening and the capture region is 0.5:1 or greater. Consequentially, the staggered interlocking structure has diminished pull strength relative to the interlocking structures—e.g., 212, 232. Additionally, the staggered interlocking structure has walls having smooth side surfaces (i.e., lack of multi-angles), thus contributing to the general lack of difference in size between the opening and the capture region. Additionally, it is noted that the walls of the voids that make up the staggered interlocking structure have destabilized and/or lack of walls. Consequently, the smooth side surfaces are unable to entirely attach or bond to a bulk layer such that an air gap is present along a junction between the bulk layer and the walls, which consequently can allow for moisture and other contaminants to easily reach the metal substrate. Additionally, the external surface of the over-etched surface is generally uneven (i.e., lacking a generally flat surface) due to the multiple voids that overlap each other. Consequently, it is difficult for the overly-etched part to form a tight seal with a bulk layer.

Additionally, FIG. 5 illustrates that the interlocking structure 410 has a penetration depth ($H_2$) of about between about 25 to about 200 micrometers. Because of the reduced penetration depth of each interlocking structure 410, there can be a discrete separation between each of the interlocking structures 410 and their respective walls 412 (i.e., walls 412 are intact). Furthermore, as will be described in greater detail with reference to FIG. 6A, the interlocking structure 410 has walls 412 with multi-angle side surfaces or multi-cracks, thus contributing to the significant difference in size between the opening (Wo) and the undercut region (Wu). As described herein, the term undercut region of the interlocking structure 410 can refer to an internal region of the metal part or enclosure having walls 412 that form overhangs that separate the opening (Wo) from the undercut region (Wu).

Figure 6A:
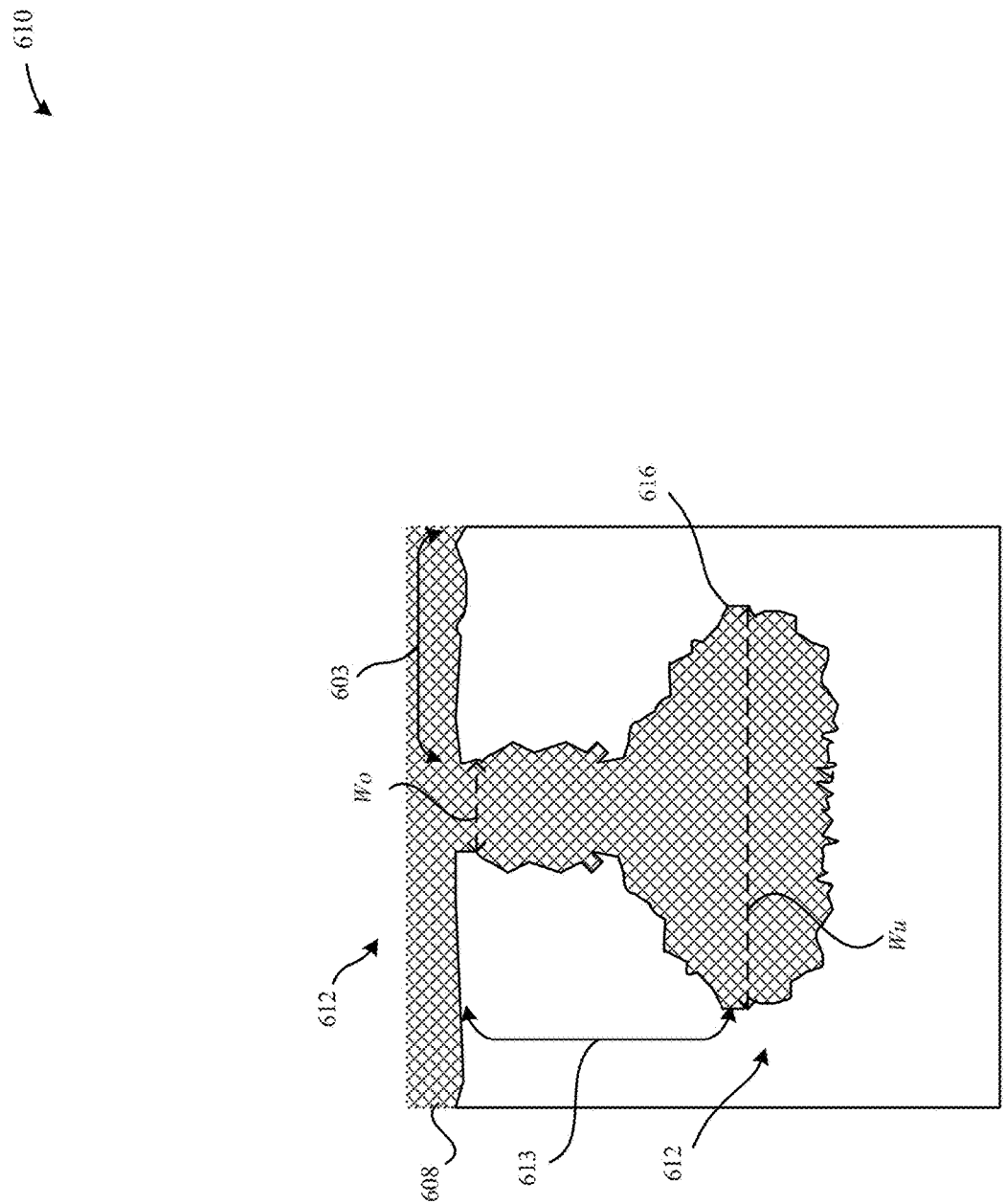
FIG. 6A illustrates a cross-sectional view of a portion of a metal part having an interlocking structure, in accordance with some embodiments.

FIG. 6A illustrates a cross-sectional view of a metal part 610 having an interlocking structure 612, in accordance with some embodiments. In some examples, the metal part 610 is characterized as having a moderately-etched external surface (e.g., between about 25% to about 65%). The interlocking structure 612 is characterized as having overhangs 613 that include walls 616 that define an undercut region (Wu). The interlocking structure 612 is characterized as having an opening (Wo) with a size (e.g., width, diameter, etc.) that is less than the size of the undercut region (Wu). In particular, the undercut region (Wu) is characterized as having a non-uniform width due to the presence of the overhangs 613 and the multi-angle side surfaces and cracks that are formed along the walls 616. The undercut region (Wu) and these multi-cracks can be filled with the layer 608 to define a leak inhibition path that inhibits moisture from reaching the metal substrate 204.

Additionally, it is noted that an external surface 603 of the metal part 610 is characterized as being generally flat due to the lack of voids that are formed in a moderately-etched metal part 610. Beneficially, a tight seal can be formed between the layer 608 that is attached to the metal part 610 to further inhibit moisture from reaching the metal substrate 204.

Figure 6B:
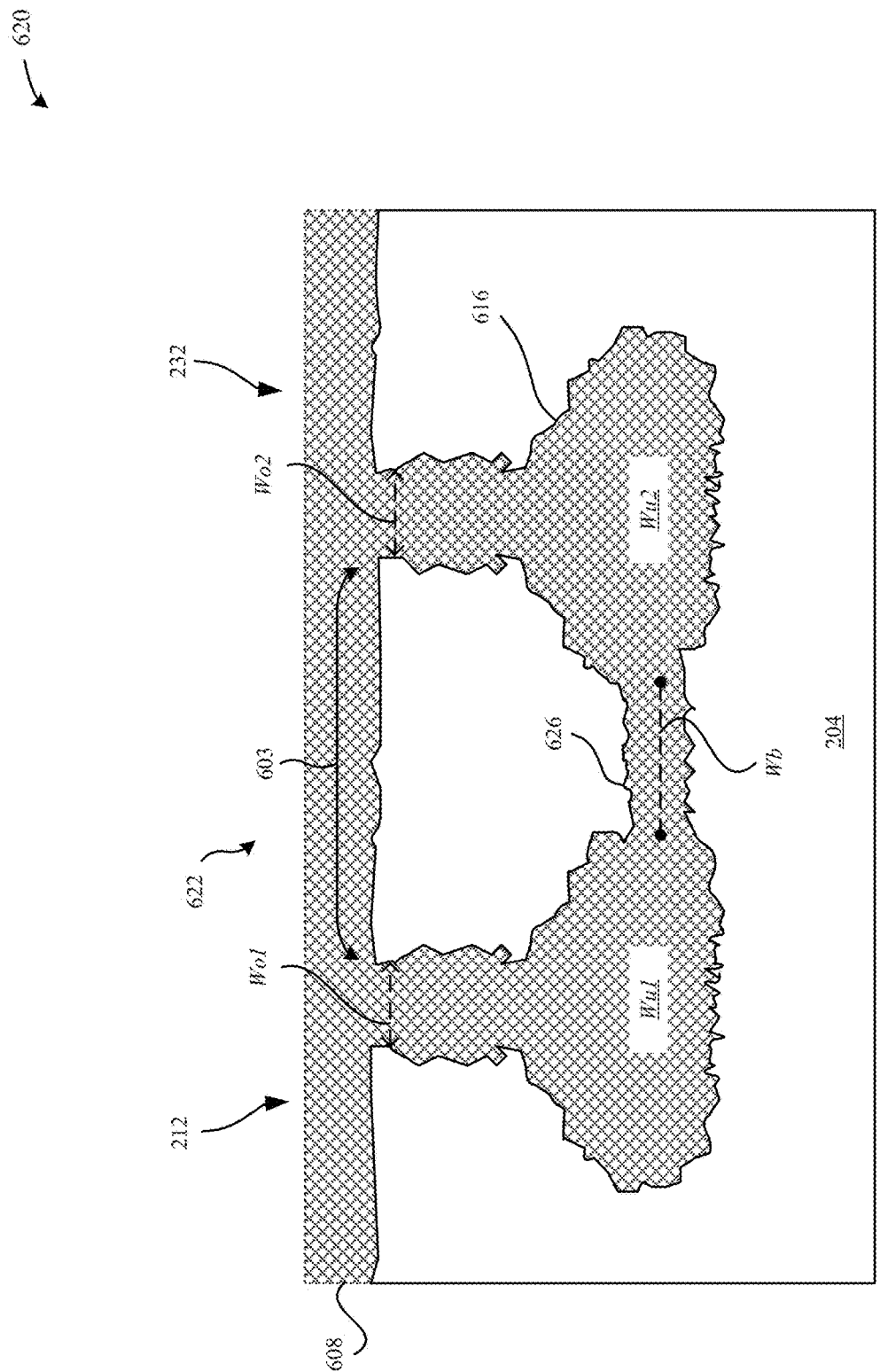
FIG. 6B illustrates a cross-sectional view of a portion of a metal part having bridged interlocking structures, in accordance with some embodiments.

FIG. 6B illustrates a cross-sectional view of a metal part 620 having a bridged interlocking structure 622, according to some embodiments. The bridged interlocking structure 622 can include multiple openings Wo1, Wo2 that lead into a bridged region (Wb). In some examples, the bridged region (Wb) can connect or bridge adjacently formed interlocking structures—e.g., the interlocking structures 212, 232 together such that a total width of the bridged interlocking structures 212 and 232 is greater than the total size of their respective openings—Wo1, Wo2. The openings Wo1 and Wo2 can be separated by a portion of the metal oxide layer 206 or the metal substrate 204 of the metal part 620. In some examples, the metal part 620 can be characterized as being moderately etched. In some examples, the metal part 620 can be characterized as having a generally flat external surface 603.

Additionally, horizontal walls 626 that define the bridged region (Wb) can include multi-angle side surfaces and cracks that are formed along the horizontal walls 626. These multi-cracks can be filled with the layer 608 to define a leak inhibition path that inhibits moisture from reaching the metal substrate 204. It is noted that the metal part 620 can be formed through any one of the processes as described herein.

In some examples, the bridged interlocking structure 622 can be formed when neighboring interlocking structures 212, 232 are formed so close to each other that their respective undercut regions (Wu1, Wu2) connect to each other. This scenario as illustrated in FIG. 6B can also illustrate a variation of the techniques for forming secondary interlocking structures (Ws) as described with reference to FIG. 3. It should be noted that the general shape of each of the interlocking structures 212, 232 that are bridged together is maintained. However, portions of the walls 616 that define the multi-angle side surfaces are exposed. It should also be noted that a minimal separation distance between these interlocking structures 212, 232 is also maintained.

FIGS. 7A-7B illustrate exemplary electron microscope images of a metal part subsequent to an etching process, in accordance with some embodiments. FIG. 7A illustrates a top view of an external surface 704 of a metal part 700, where the metal part 700 can be characterized as having a moderately etched external surface. As shown in FIG. 7A, multiple interlocking structures 702a-c are formed at different regions of the external surface 704, and have respective openings separated by a separation distance (Sd) that is greater than a minimal separation distance such that the openings of the neighboring interlocking structures 702a-c do not generally overlap with one another. In some examples, the separation distance between neighboring interlocking structures 702a-c is between about 10 micrometers to about 500 micrometers. In other examples, the separation distance between the interlocking structures 702a and 702b is about 150 micrometers.

FIG. 7B illustrates a top view of a 10× magnified region 706 of the external surface 704 of the metal part 700. In particular, FIG. 7B illustrates that the interlocking structures 702b-c of the magnified region 706 have roughened side surfaces that define the openings of these interlocking structures with multi-cracks or multi-angle side surfaces that into undercut regions.

Figure 8:
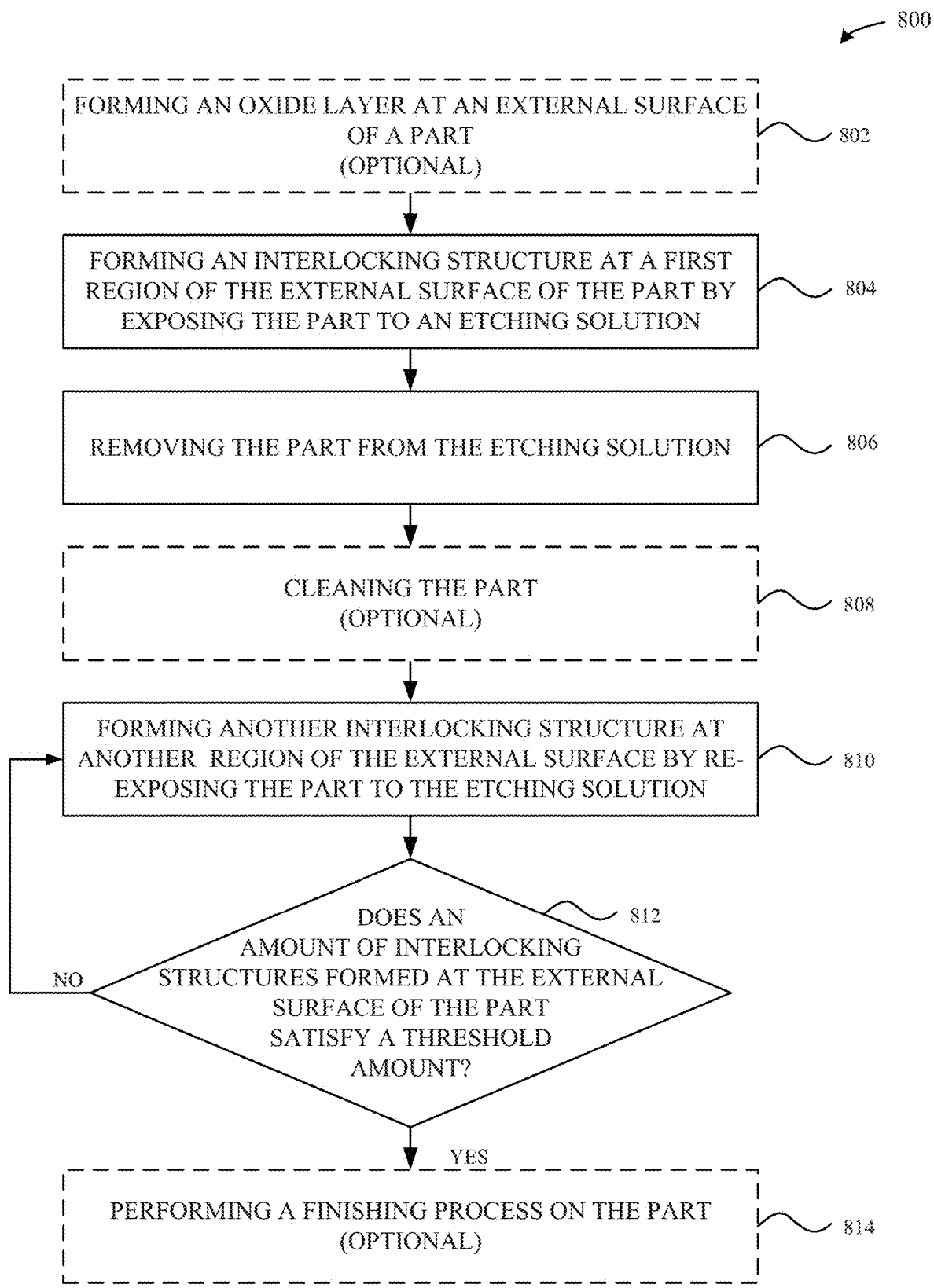
FIG. 8 illustrates a method for processing a metal part, in accordance with some embodiments.

FIG. 8 illustrates a method 800 for forming interlocking structures at an external surface of a metal part, according to some embodiments. As illustrated in FIG. 8, the method 800 can optionally begin at step 802, where a part—e.g., a metal substrate 204—is optionally treated by oxidizing a portion of a metal substrate 204 to form a metal oxide layer 206 that is disposed over the metal substrate 204. In some examples, the metal oxide layer 206 can be formed by at least one of a non-electrolytic passivation process or an electrolytic anodization process. In other examples, an external surface of the metal substrate 204 can also be optionally treated by subjecting the metal substrate 204 to a cleaning process or a texturizing process. In particular, the texturizing process can be beneficial in providing a roughened external surface that can promote growth of the metal oxide layer 206 at those roughened regions.

At step 804, an interlocking structure—e.g., the first interlocking structure 212—can be formed at a first region of the external surface 202 of the metal part 200 by exposing the metal part 200 to an etching solution. In particular, the etching solution can include a combination of a chloride (Cl—) for weakening or breaking down the passivation oxide layer and an oxidant (e.g., FeCl$_3$, HCl, etc.) for etching the weakened passivation oxide layer, thereby forming the first interlocking structure 212 at the external surface 202.

Subsequently, at step 806, the metal part 210 is removed from the etching solution. In some examples, any remaining acid (e.g., HCl) from the etching solution that is present on the external surface 202 can further contribute to increasing the size of the first interlocking structure 212. When the metal part 210 is removed from the etching solution, the exposed portion of the metal substrate 204 where the first interlocking structure 212 is formed can be oxidized. In particular, the passivation oxide layer 222 that is formed can be caused by rinsing the metal part 210 of the etching solution and exposing to air, which can act to seal the exposed portion of the metal substrate 204 from moisture and contaminants.

At step 808, the metal part 220 can be optionally cleaned such as to remove any of the etching solution from the external surface 202 of the metal part 220. For example, the cleaning process can involve rinsing the external surface 202 with deionized water. In effect, the cleaning process can also halt the growth of the first interlocking structure 212.

At step 810, another interlocking structure—e.g., the second interlocking structure 232—can be formed at a second region of the external surface 202 of the metal part 220 by re-exposing the metal part 220 to the etching solution.

Subsequently, at step 812, the process (e.g., the user, a computing device, etc.) can involve determine whether an amount of the interlocking structures—e.g., 212, 232—that are formed at the external surface 202 of the metal part 230 satisfy a threshold amount of interlocking structures that cover the surface area of the external surface 202. For example, the threshold amount is between about 25% to about 65% of the total surface area, which can correspond to a moderately etched surface. It should be noted that is preferable that the threshold amount is less than 80% as this can result in a significantly impaired pull strength of the metal part 230. In some examples, an electron microscope or any suitable 3-D image scanning system can be utilized to determine when the amount of interlocking structures satisfies the threshold amount.

At step 814, in response to determining that the amount of interlocking structures satisfies the threshold amount, then the method can proceed to performing a finishing process on the metal part 230. In some embodiments, the finishing process can involve attaching a non-metal layer 252 to the metal part 230. In particular, the non-metal layer 252 can be bonded or attached to the metal part 230. For example, while the non-metal layer 252 is in a melted state under a high temperature, it can be allowed to flow into the interlocking structures—e.g., 212, 232—of the metal part 230. When the polymer material flows into these interlocking structures, the polymer can penetrate into the undercut regions (Wu) of these interlocking structures and fill in multi-angle side surfaces of the walls that define these undercut regions. After flowing into these undercut regions (Wu) the polymer material can be allowed to harden into protruding portions or attachment features 256. Upon changing into the solid state, the non-metal layer 252 physically attaches or bonds to the metal part 240 in order to form the multi-layer part 250. In other examples, the finishing process can involve performing a finishing process or a cleaning process on the external surface 202 of the metal part 230.

Returning back now to step 812, if the amount of interlocking structures does not satisfy the threshold amount, then additional interlocking structures can be formed at the external surface 202 of the metal part 230. Subsequent to the formation of additional interlocking structures, the 3-D mapping can be performed to determine whether a sufficient amount of interlocking structures cover the external surface. These steps can be repeated until the amount of interlocking structures satisfies the threshold amount.

Figure 9:
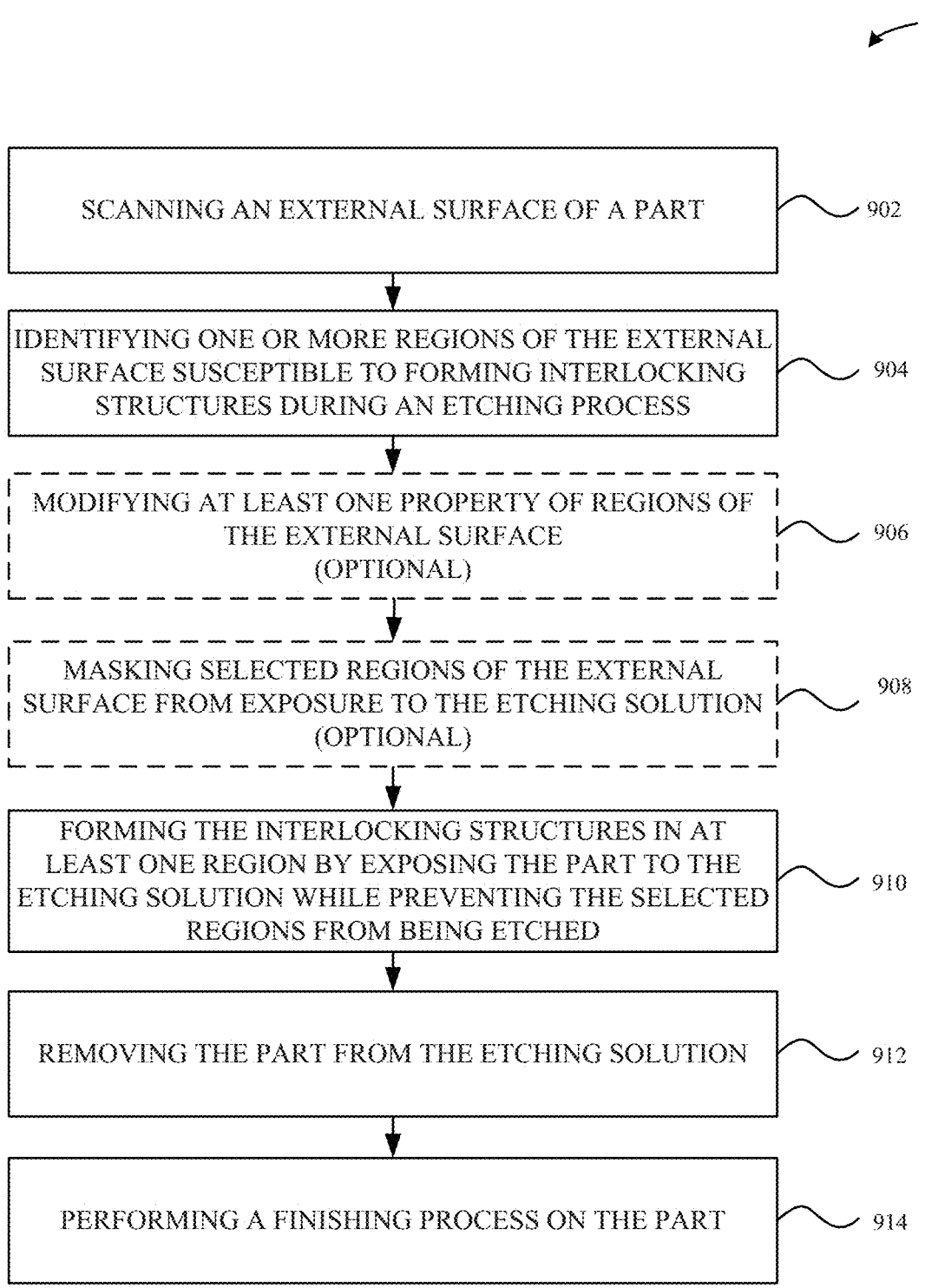
FIG. 9 illustrates a method for processing a metal part, in accordance with some embodiments.

FIG. 9 illustrates a method 900 for forming interlocking structures at an external surface of a metal part, according to some embodiments. As illustrated in FIG. 9, the method 900 can begin at step 902 where an external surface 202 of the metal part 200 is scanned using a 3-D image scanning system, electron microscope, or other suitable system. At step 904, in some examples, the external surface 202 of the metal part 200 can be scanned in order to determine regions of the metal oxide layer 206 having defects (e.g., deficiency in chromium present, highly stressed passivation oxide film, etc.) that may lend these regions susceptible to being etched during a subsequent etching process. In other examples, the external surface 202 can be scanned in order to identify regions where a non-metal layer 252 is desired to be attached to those specific regions of the metal part 200, such as if those regions correspond to parts of an external surface having a multi-layer enclosure or composite part. For example, the external surface 202 can be scanned to determine regions for receiving the non-metal layer 252.

At step 906, one or more of the regions of the external surface 202 can be optionally modified, such as by performing a texturizing process onto one or more specific regions in order to create defects or weaknesses within the metal oxide layer 206 that are susceptible to being etched. For example, the metal oxide layer 206 that is disposed over the metal substrate 204 can be deliberately textured in order to affect the amount of chromium present in regions of the metal oxide layer 206. In this manner, the user can control which regions of the external surface 202 will be etched to form interlocking structures. In other examples, the etching solution can attack regions of the metal oxide layer 206 having a machining defect, grain boundary weaknesses, or weaknesses in the particles present in the metal oxide layer 206. In other examples, these one or more regions can be laser etched. In other examples, specific regions can be intentionally induced to form a thicker metal oxide layer 206 with greater amount of chromium than other regions such that these other regions may be susceptible to being etched.

Additionally, at step 908, one or more of the regions that are identified as being susceptible to the etching process can be optionally masked, such as by using a photolithography process. By masking these one or more regions, they are covered and generally prevented from being exposed to the etching process regardless of the chemical or metallurgical properties of these one or more regions. It is noted that these one or more regions can include regions identified as being susceptible to forming etched interlocking structures as a result of the etching process.

At step 910, interlocking structures—e.g., 212, 232—can be initially formed at one or more different regions of the external surface 202 by exposing those regions of the external surface 202 that are un-masked to the etching process while preventing masked regions from being etched. At step 912, the metal part 230 can be removed from the etching solution in order to stop the etching process. In some examples, any remaining etching solution present on the external surface 202 can be cleaned by using deionized water such as to prevent the interlocking structures from further growing.

At step 914, in response to determining that the amount of interlocking structures satisfies the threshold amount, then the method can proceed to performing a finishing process on the metal part 230. In some embodiments, the finishing process can involve attaching a non-metal layer 252 to the metal part 230. In particular, the non-metal layer 252 can be bonded or attached to the metal part 230. In other examples, the finishing process can involve performing a finishing process or a cleaning process on the external surface 202 of the metal part 230.

Figure 10:
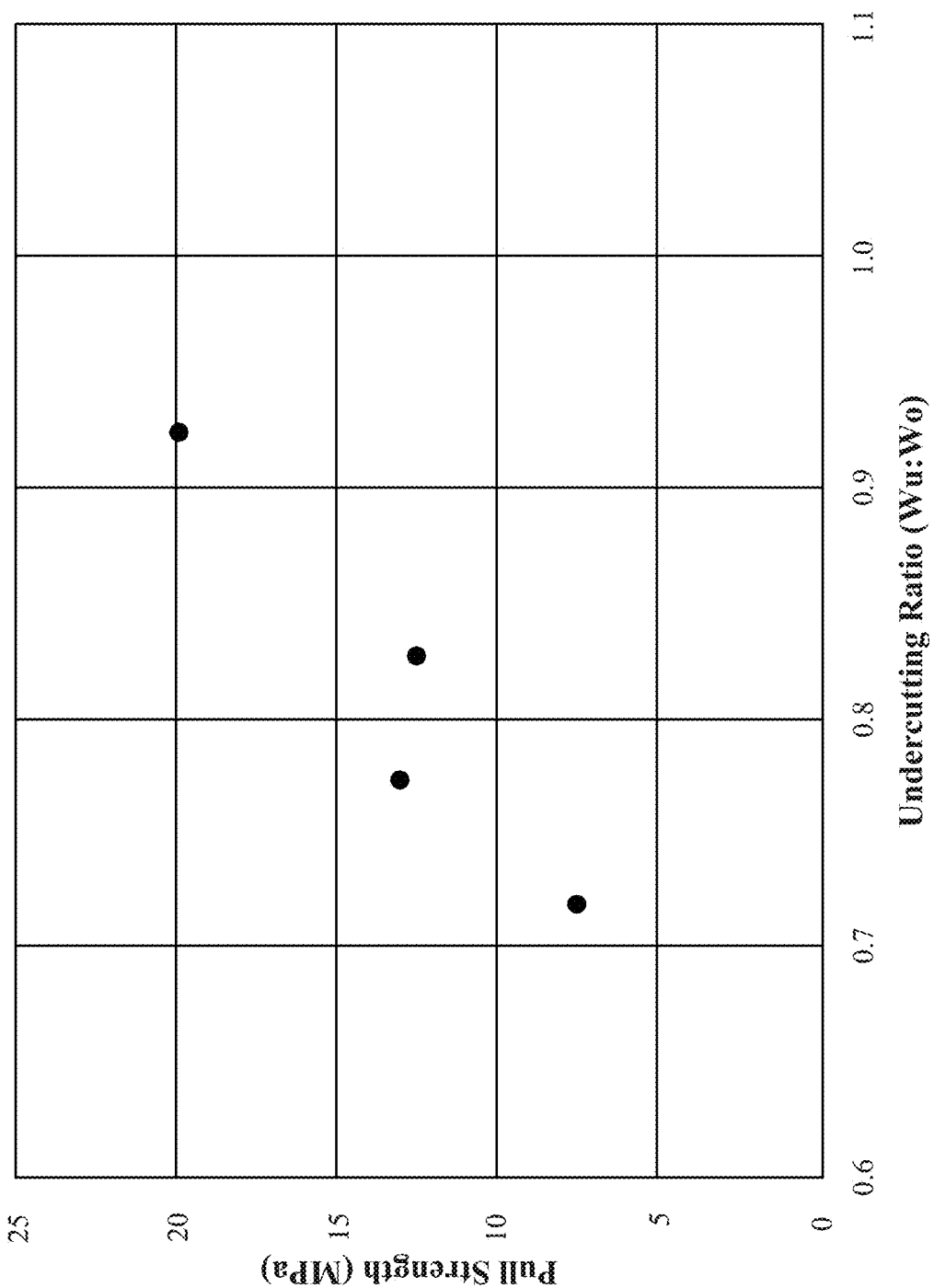
FIG. 10 illustrates a graph indicating a relationship between an undercut ratio and pull strength of a metal part, in accordance with some examples.

FIG. 10 illustrates a graph indicating a relationship of pull strength as a function of an undercutting ratio, in accordance with some examples. In particular, the graph indicates a causal relationship between the undercut ratio (i.e., the ratio between the undercut region (Wu) relative to the opening (Wo)) and the effect on pull strength (MPa) of the metal part. In accordance with some exemplary trials, metal parts were etched to form interlocking structures. The etched interlocking structures exhibited an undercut ratio range between about 0.7 to about 0.95. The samples of metal parts having etched interlocking structures with an undercut ratio of about 0.7 exhibited a pull strength of about 7 MPa. The samples of metal parts having etched interlocking structures with an undercut ratio of between about 0.75 to about 0.85 exhibited a pull strength of about 12-13 MPa. The samples of metal parts having etched interlocking structures with an undercut ratio of about 0.92 exhibited a pull strength of about 20. It should be noted that an increase in pull strength is beneficial in maintaining the attachment between the metal part and the non-metal material, particularly when the metal part is subjected to physical abuse.

Figure 11:
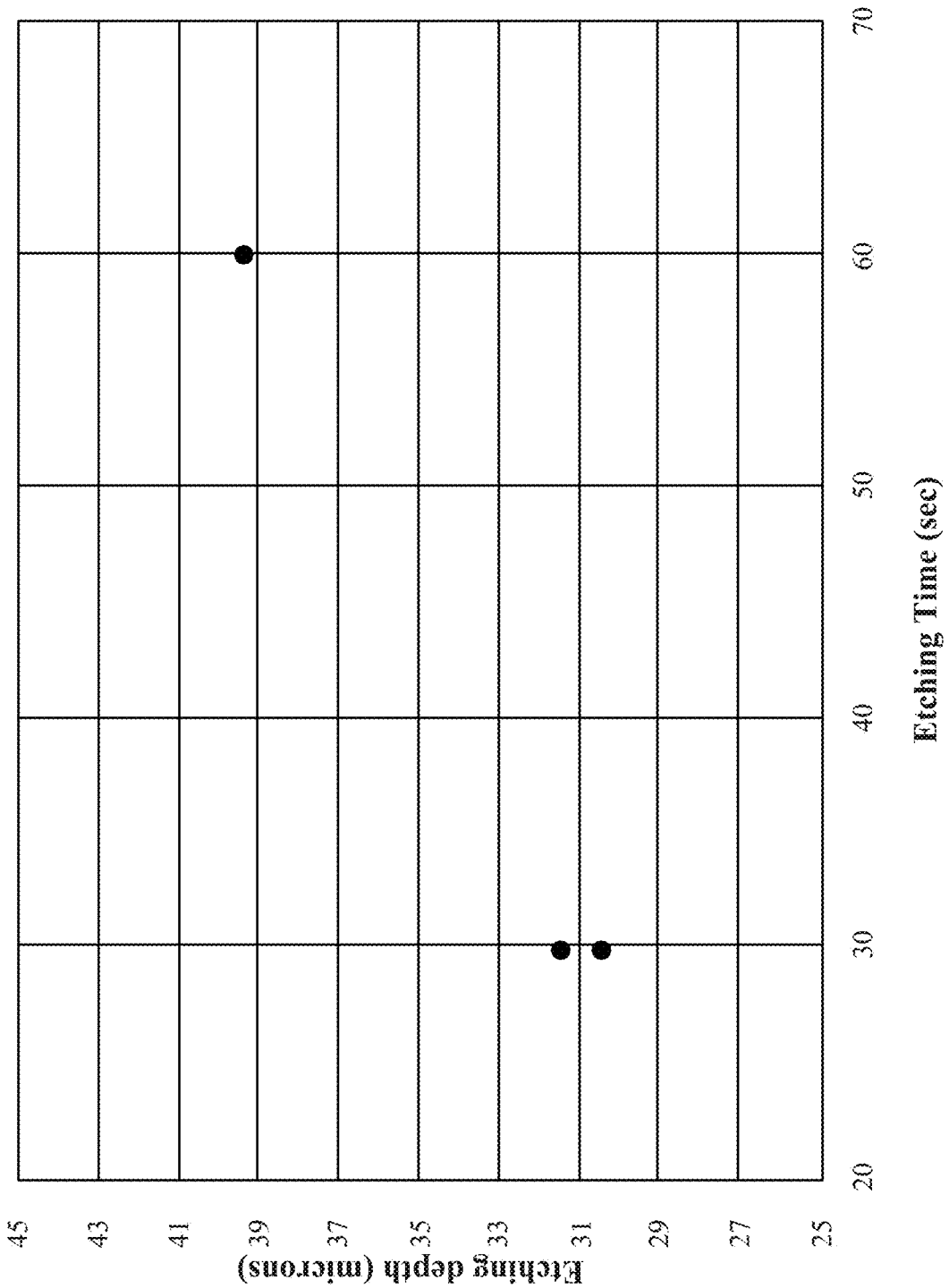
FIG. 11 illustrates a graph indicating a relationship between etching time and an etching depth of a metal part, in accordance with some examples.

FIG. 11 illustrates a graph indicating a relationship of etching depth as a function of etching time, in accordance with some examples. In particular, the graph indicates a causal relationship between the etching time (seconds) and the effect on etching depth (micrometers) of the metal part. In accordance with some exemplary trials, metal parts were etched for durations of either 30 seconds or 60 seconds. The metal parts that were etched for the duration of 30 seconds exhibited an etching penetration depth of between about 29 to about 31 micrometers. The metal parts that were etched for the duration of 60 seconds exhibited an etching penetration depth of about 39 micrometers. Accordingly, these exemplary trials support that the overall depth of penetration of each of these interlocking structures can be directly attributed to the duration of the etching cycle.

Additionally, other experimental trials were performed on the etched metal part, as described herein. In some exemplary trials, a coupon pull strength test of a bounding area of the etched metal part was performed. The bounding area (or adhesion area) between the etched metal part and the non-metal material was 50 mm$^2$ or 0.5 cm$^2$. The non-metal material includes plastic resin AV651, which is a polyaryletherketone (PAEK). In the exemplary trials, a non-etched metal part without etched interlocking structures exhibited a coupon pull strength of 0. In other words, a coupon pull strength of 0 indicates a lack of adhesion (or binding) between the metal part and the non-metal material. In contrast, an etched metal part with etched interlocking structures exhibited a coupon pull strength of 37 kgf or 74 kgf/cm$^2$. Additionally, the etched metal part with etched interlocking structures exhibited a coupon pull strength range of between 60-100 kgf/cm$^2$.

In some exemplary trials, a band pull strength test was performed. In some examples, the band pull strength test was performed on a generally rectangular internal frame of an electronic device (e.g., the smartphone 102) that includes the metal part having etched interlocking structures, as described herein. The internal frame can include four corners, which can each be individually referred to as splits. These splits can be capable of receiving a molded plastic, and thus can be referred to as bounding areas. Each of the four corners of the internal frame can include machined interlocking structures that are integrally formed with the internal frame prior to an etching process. Subsequently, some of the corners of the internal frame were exposed to an etching process to form etched interlocking structures. Additionally, molded plastic (e.g., AV651) was inserted into the machined interlocking structures and the etched interlocking structures. In the exemplary trials, samples of the internal frame having a top left corner (without an etched interlocking structure) exhibited a band pull strength (TL) of about 28 kgf. In contrast, samples of the internal frame having a top left corner with an etched interlocking structure exhibited a band pull strength (TL) of about 101 kgf. Accordingly, these exemplary trials support that the presence of the etched interlocking structure exhibits far superior ability to maintain attachment to the non-metal material relative to the machined interlocking structures.

In some exemplary trials, an air leakage test was performed on the etched metal parts of the electronic device (e.g., the smartphone 102). In particular, the air leakage test was performed on the splits of the generally rectangular internal frame of the electronic device including the metal part having etched interlocking structures, as described herein. The air leakage test can be used to determine a sealing capability of the splits. This is particular notable, as the splits of the internal frame are generally the only regions of the internal frame which are etched to form etched interlocking structures. In some examples, the splits of the internal frame include a PU coating that acts as a sealant between the molded plastic that is injected into the etched interlocking structures. In the trials, samples of the internal frame having splits with etched interlocking structures were subjected to a test pressure of −0.5 bar and exhibited a leakage rate of less than 0.05 standard cubic centimeter per minute (sccm). In other samples, the internal frame having splits with etched interlocking structures exhibited a leakage rate of between about 0.05 sccm-0.2 sccm. In contrast, samples of the internal frame having splits without etched interlocking structures (e.g., machined interlocking structures) exhibited a leakage rate of greater than 1.0 sccm. It should be noted that the electronic device generally has an acceptable tolerance limit of 0.2 sccm. Thus, samples of the internal frame having splits without the etched interlocking structures failed to impart an acceptable leakage rate within the acceptable tolerance limit of 0.2 sccm. Consequently, internal frames without the etched interlocking structures demonstrate inferior water sealant quality relative to internal frames having the etched interlocking structures.

Etching for Bonding Non-Metal Material to Anodized Metal Parts

Figure 12A:
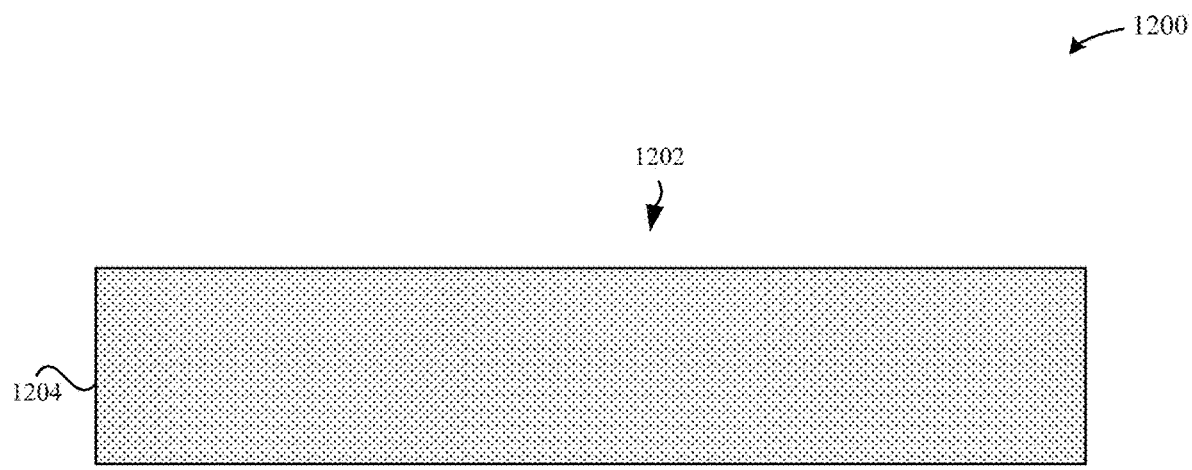
FIGS. 12A-12E illustrate cross-sectional views of a process for forming interlocking structures at an external surface of an anodized metal part, in accordance with some embodiments.

FIGS. 12A-12E illustrate cross-sectional views of a metal part undergoing a process for forming interlocking structures at an external surface of a metal part, in accordance with some embodiments. FIG. 12A illustrates a metal part 1200 prior to undergoing an electrochemical etching process for forming the interlocking structures. In some examples, the metal part 1200 has a near net shape of a final part, such as the enclosures of the portable devices 102, 104, 106, and 108. In some examples, the metal part 1200 may be bonded to a non-metal part to assume a final part, such as the enclosures of the portable devices 102, 104, 106, and 108. It should be further noted that the technique described herein are not limited towards etching for bonding non-metal material to anodized metal parts, and may also be utilized for general etching of metal parts, such as stainless steel.

As illustrated in FIG. 12A, the metal part 1200 includes a metal substrate 1204. The metal substrate 1204 includes an external surface 1202 that is capable of receiving a bulk portion that is formed of a non-metal material subsequent to an electrochemical etching process. In some examples, the metal substrate 1204 is comprised of aluminum or is an aluminum alloy. Additionally, the metal substrate 1204 may include alloying elements such as magnesium, zinc, silicon, iron, zirconium, copper, and the like. According to some embodiments, the metal substrate 1204 is a three-dimensional structure having a geometry that is suitable for forming a metal oxide layer and for attaching a non-metal layer to the metal part 1200. In some examples, the metal substrate 1204 has a geometry that is characterized as being rectangular, polygonal, circular, beveled edges, non-linear, angular edges, elliptical, etc.

Figure 12B:
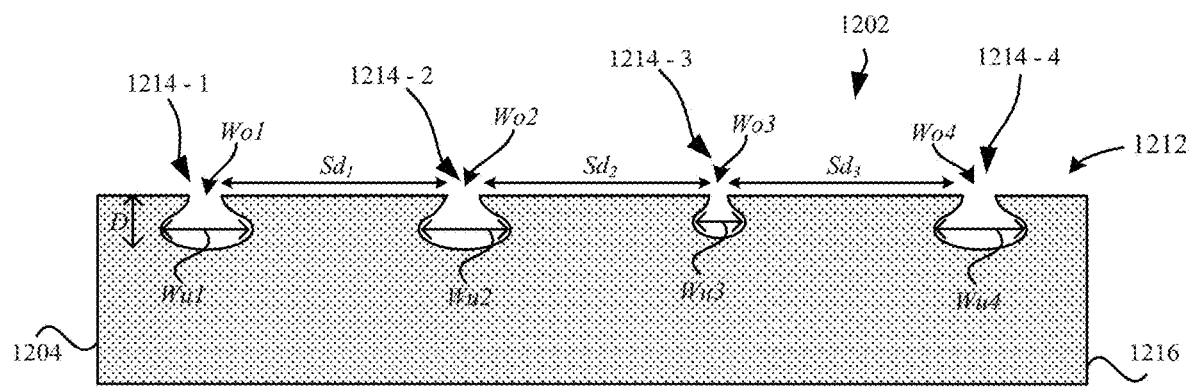

According to some embodiments, FIG. 12B represents an etched metal part 1210 subsequent to a surface treatment process, such as an electrochemical etching process. In particular, FIG. 12B illustrates that subsequent to the electrochemical etching process, an external surface 1202 of the etched metal part 1210 includes openings of a first interlocking structure 1214-1, a second interlocking structure 1214-2, a third interlocking structures 1214-3, and a fourth interlocking structure 1214-4. According to some embodiments, each of the interlocking structures—e.g., 1214-1, 2, 3, 4—may be formed as a result of a single electrochemical etching process or multiple electrochemical etching processes. For instance, the first and second interlocking structures 1214-1, 2 are formed as a result of exposure of the metal substrate 1204 to a first electrochemical etching process. Thereafter, a second electrochemical etching process is performed on the metal substrate 1204, thereby forming the third and fourth interlocking structures 1214-3, 4.

According to some embodiments, the amount of penetration depth of the interlocking structures 1214-1, 2, 3, 4 into the etched metal part 1210 is based on a respective size of each of the interlocking structures 1214. In some examples, the interlocking structures 1214-1, 2, 3, 4 have a length (i.e., a depth of penetration) into the external surface 202 that is greater than 5 micrometers. Preferably, the interlocking structures 1214-1, 2, 3, 4 have a depth of at least 50 micrometers in order to facilitate attaching to the non-metal layer. It should be noted that the overall depth of penetration of each of these interlocking structures 1214-1, 2, 3, 4 can be directly attributed to the parameters of the electrochemical etching process (e.g., duration, current density, concentration of solution, etc.). According to some embodiments, the interlocking structures 1214-1, 2, 3, 4 have diameters that are between about 20 micrometers to about 70 micrometers in diameter.

According to some embodiments, each of the interlocking structures 1214-1, 2, 3, 4 of the etched metal part 1210 are capable of receiving an attachment feature (or micro-portion) of the non-metal material, as described in greater detail with reference to FIG. 12D. According to some embodiments, the interlocking structures—e.g., the first interlocking structure 1214-1 is characterized as having an opening (Wo1) that leads into an undercut region (Wu1). In some examples, the opening (Wo1) of the first interlocking structure 1214-1 extends into an undercut region (Wu1) of the metal substrate 1204. The interlocking structures—e.g., 1214-1, 2, 3, 4, may be characterized as having an undercut geometry. The undercut geometry is defined as the width of the opening (Wo1) is less than a width of the undercut region (Wu1). Additionally, the undercut geometry may also be defined as the depth (D) of the interlocking structures is greater than the opening (Wo1). In some examples, the ratio of the width of the opening (Wo1) to the width of the undercut region (Wu1) is between about 1:1.1 to 1:1.3. in some examples, the ratio of the width of the opening (Wo1) to the width of the undercut region (Wu1) is 1:2. It should be noted that so long as the ratio between Wo1:Wu1 is less than 1:1, the widths of Wo1 and Wu1 may be of any sufficient size to capture and retain a portion of the non-metal layer.

Additionally, walls of the metal substrate 1204 that define the openings (Wo) and the undercut regions (Wu) can include multi-angle side surfaces and cracks. Subsequently, while filling these interlocking structures with non-metal material, these multi-angle side surfaces are filled and/or lined with the non-metal material so as to prevent external moisture from reaching the metal substrate 204.

As illustrated in FIG. 12B, the openings (Wo) of the interlocking structures—e.g., 1214-1, 2, 3, 4 may be separated by a minimum separation distance (Sd). In some examples, the openings are generally evenly distributed from each other such that there is a generally uniform separation distance between these openings. For example, FIG. 12B illustrates that the opening (Wo2) is evenly distributed from the opening (Wo1) and the opening (Wo3). However, in other examples, the openings may also be randomly distributed from each other. Indeed, it should be noted that during the electrochemical etching process, portions of the external surface 1202 may be masked to prevent formation of interlocking structures such that a pre-determined pattern of interlocking structures 1214 may be formed at the metal part 1210.

In some examples, the minimal separation distance is in the order of tens to hundreds of micrometers such that openings of neighboring interlocking structures do not overlap one another and result in destabilization of respective etched walls 1216 of the neighboring interlocking structures. In some examples, the minimal separation distance corresponds to etched walls that define the undercut region (Wu) being generally intact. For example, referring to FIG. 12B, openings (Wo) of the interlocking structures 1214-3 and 1214-4 are separated by a separation distance ($Sd_3$) such that walls 1216 that define the undercut regions (Wu) of each of the respective interlocking structures 1214-3, 4 are not destabilized by the presence of the neighboring interlocking structures. In this manner, the shape and size of the undercut regions (Wu) is generally maintained. In some examples, any number of the interlocking structures—e.g., 1214-1, 2, 3, 4 can be discretely and independently formed from each other. However, it should be noted that interlocking structures constitute between about 25% to about 70% of the external surface 2303. By instituting moderate etching of the external surface 1202, a respective pull strength for each interlocking structure can be optimal. Beneficially, the etched metal part 1210 is characterized as having a moderately etched external surface imparts a strong amount of adhesion between the etched metal part 1210 and a non-metal layer (e.g., polymeric layer, etc.) as described in greater detail with reference to FIG. 12C.

According to some embodiments, prior to the electrochemical etching process, the external surface 1202 of the metal substrate 1204 is relatively flat. Subsequent to the electrochemical etching process, the external surface 1202 may remain relatively flat in order to maintain the pre-existing geometry (e.g., shape) of the metal part 1200.

According to some embodiments, the electrochemical etching process refers to removing an amount of metal material from the external surface 1202 of the metal substrate 1204 to impart a different texture to the external surface 1202. In some examples, the electrochemical etching process involves exposing the metal substrate 1204 to an alkaline solution having a range of 2-15 g/L of sodium nitrate. The sodium nitrate is a deoxidizer. The metal substrate 1204 is exposed to the solution at a temperature range anywhere between about 20° C. to about 50° C. at a pH level anywhere between 9-11. Additionally, the metal substrate 1204 is exposed to the solution at an anodic current density of anywhere between 1-10 Amps/dm$^2$ for a duration of anywhere between 1-15 minutes. In particular, adjusting the applied current density can directly affect the size (e.g., diameter of the interlocking structures, etc.), density of the interlocking structures, and the number of the interlocking structures.

Furthermore, it should be noted that the electrochemical etching process may preferably utilize a chloride-free process. Indeed, use of chloride-based solutions such as hydrochloric acid may contribute to corrosion of those metal substrates formed from aluminum alloys. Moreover, it should be noted that many traditional strong acids (e.g., hydrochloric acid, nitric acid, etc.) used in conventional electrograining processes (e.g., photolithography, etc.) are ill-suited for forming the interlocking structures—e.g., 1214-1, 2, 3, 4—as described herein. In particular, these traditional strong acids used for electrograining processes require alternating current processing equipment, and therefore, are not readily compatible with anodizing equipment and processes. Moreover, even if these strong acids for electrograining processes were utilized, they would fail to produce the undercut geometry that is uniquely characteristic of the interlocking structures as described herein. Instead these types of strong acids (e.g., chromic-sulfuric acid, ferric sulfate, sulfuric acid etc.) would form hemispherical pores or shallow, lightly scalloped cuts with micron-scale roughness during the etching process of anodized metal parts. It should be noted that these lightly scalloped cuts are generally insufficient to provide the necessary metal and non-metal bond strength that is required to provide enclosures for portable electronic devices having a structural band with necessary water-proofing and pull strength. In contrast, the interlocking structures are characterized as having undercut geometry or an ellipsoidal shape.

Figure 12C:
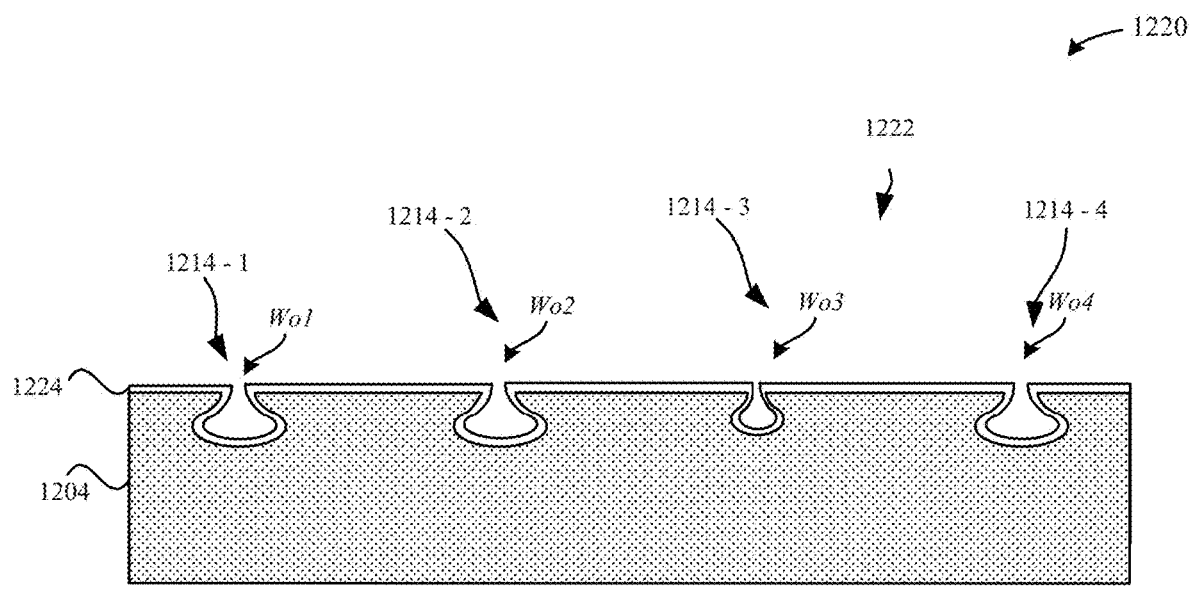

According to some embodiments, FIG. 12C represents an anodized metal part 1220 subsequent to an anodization process. In particular, FIG. 12C illustrates that subsequent to the anodization process, a metal oxide layer 1224 is formed from material of the metal substrate 1204, including the metal material of the metal substrate 1204 that defines the interlocking structures—e.g., 1214-1, 2, 3, 4. As illustrated in FIG. 12C, the metal oxide layer 1224 overlays the relatively flat regions of the external surface 1202 as well as the interlocking structures 1214-1, 2, 3, 4 of the metal substrate 1204. Beneficially, the metal oxide layer 1224 acts as a barrier that prevents/minimizes external contaminants from reaching the underlying metal substrate 1204. Indeed, the metal oxide layer 1224 may impart the anodized metal part 1220 with corrosion resistance.

Additionally, the metal oxide layer 1224 is formed over the walls 1216 that define the opening (Wo) and the undercut region (Wu) of each of the interlocking structures. The metal oxide layer 1224 may have a shape that corresponds to the underlying shape of the interlocking structures. Thus, the metal oxide layer 1224 may also include multi-angle side surfaces and cracks. Subsequently, while filling these interlocking structures with non-metal material, these multi-angle side surfaces are filled with the non-metal material so as to prevent external moisture from reaching the metal substrate 204.

According to some examples, the metal oxide layer 1224 has a thickness of between about 500 micrometers to about 700 micrometers. Furthermore, the metal oxide layer 1224 includes pore structures (not illustrated) having pore sizes of about 40 nanometers. It should be noted that although the formation of the metal oxide layer 1224 from material of the metal substrate 1204 that is oxidized may decrease the size of the openings (Wo) and/or the size of the undercut regions (Wu), the interlocking structures 1214 still retain the undercut geometry. Beneficially, the pore structures combine with the interlocking structures 1214 to facilitate attaching the non-metal layer to the anodization metal part 1220.

In some examples, prior to undergoing the anodization process, the etched metal part 1210 is subjected to a two-stage counter-flowed rinse in order to remove the etching solution (e.g., sodium nitrate, etc.). During the anodization process, the etched metal part 1210 is exposed to an anodization solution, such as phosphoric acid. In some examples, the phosphoric acid may be used at a concentration of about 10 weight % to about 12 weight %. Additionally, a current density is applied to the etched metal part 1210 between about 0.5 to about 0.8 $A/dm^2$. The etched metal part 1220 is exposed to a temperature between about 20° C. to about 24° C. for a duration between about 20 minutes to about 25 minutes. Notably, phosphoric acid anodizing generates a metal oxide layer 1224 having a thickness of between about 500 nm-700 nm thickness with a porosity on a scale of tens of nanometers. The resulting metal oxide layer 1224 may be readily wetted by the non-metal material (e.g., epoxy) so as to form a strong adhesive bond. In other examples, the etched metal part 1210 is exposed to a sulfuric acid anodization solution, such as 200 g/L of sulfuric acid at a temperature of about 20° C. at a current density of between about 1-3 $A/dm^2$ for a period of between about 20 minutes to about 60 minutes. In other examples, the etched metal part 1210 is exposed to a boric-sulfuric acid anodizing process.

In some embodiments, during the anodization process, the metal part 1210 is exposed to an etching process (e.g., exposure to phosphoric acid) that may be applied to the metal oxide layer 1224 that results in order to enhance adhesion of the non-metal layer to the anodization metal part 1220. Subsequent to the anodization process, the anodized metal part 1220 may be rinsed and dried of the anodization solution. Thereafter, the anodized metal part 1220 may be bonded to the non-metal layer as illustrated with reference to FIG. 12D.

Figure 12D:
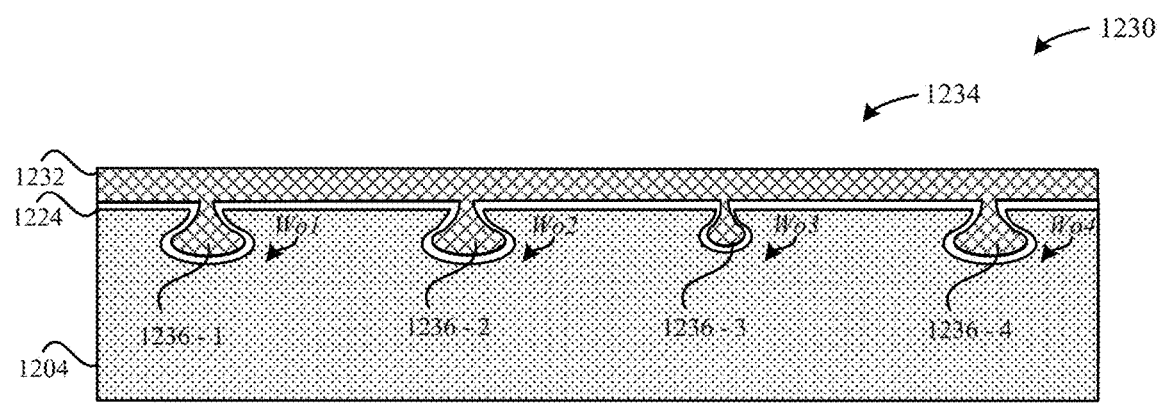

FIG. 12D a cross-sectional view of a multi-layer part 1230 (e.g., composite part) having a non-metal layer 1232 that is attached to the anodized metal part 1220, in accordance with some embodiments. In some examples, the non-metal layer 1232 can be characterized as a bulk layer having protruding features. For example, the non-metal layer 1232 can refer to a polymer material, such as polyethylene terephthalate ("PET"), polyaryletherketone ("PAEK"), or polyether ether ketone ("PEEK") that while in a melted or liquid state can be allowed to flow into the interlocking structures 1214-1, 2, 3, 4 of the anodized metal part 1230. In some examples, the non-metal layer 1232 can include a non-metal material in addition to other materials (e.g., metal, non-metal, etc.) so long as the non-metal layer 1232 is sufficient and capable of being received by the interlocking structures. In some examples, the non-metal layer 1232 can have any amount of viscosity or surface tension that is sufficient to attach to the external surface 1222 of the anodized metal part 1220. When the non-metal material flows into the interlocking structures, the polymer can penetrate into the undercut regions (Wu) of these interlocking structures 1214-1, 2, 3, 4 and fill in the undercut regions (Wu) as well as the pore structures of the metal oxide layer 1224. After flowing into these undercut regions (Wu) and the pore structures, the non-metal material can be allowed to harden into protruding portions or attachment features 1236. In particular, FIG. 12D illustrates that the first protruding portion 1236-1 is bonded at the first interlocking structure 1214-1, the second protruding portion 1236-2 is bonded at the second interlocking structure 1214-2, the third protruding portion 1236-3 is bonded at the third interlocking structure 1214-3, and the fourth protruding portion 1236-4 is bonded at the fourth interlocking structure 1214-4. Furthermore, non-metal material of the non-metal layer 1234 may fill in and be retained by the pore structures (not illustrated) of the metal oxide layer 1224. Thereafter, the non-metal material may transition from the liquid state into a solid state. Upon changing into the solid state, the non-metal layer 1234 is physically attached or bonded to the anodized metal part 1220 in order to form the multi-layer part 1230. As illustrated in FIG. 12D, the non-metal layer 1234 in the solid state can be disposed so that it is relatively flush with the external surface 1222 of the anodized metal part 1220. The multi-layer part 1230 that is formed as a result can have an external surface 1234 that can correspond to the enclosures of the portable devices—e.g., 102, 104, 106, and 108. It should be noted that the multi-layer part 1230 can refer to a peripheral band that surrounds the enclosure where the non-metal layer 1234 can impart electrical isolation between different metal sections of the enclosure.

Figure 12E:
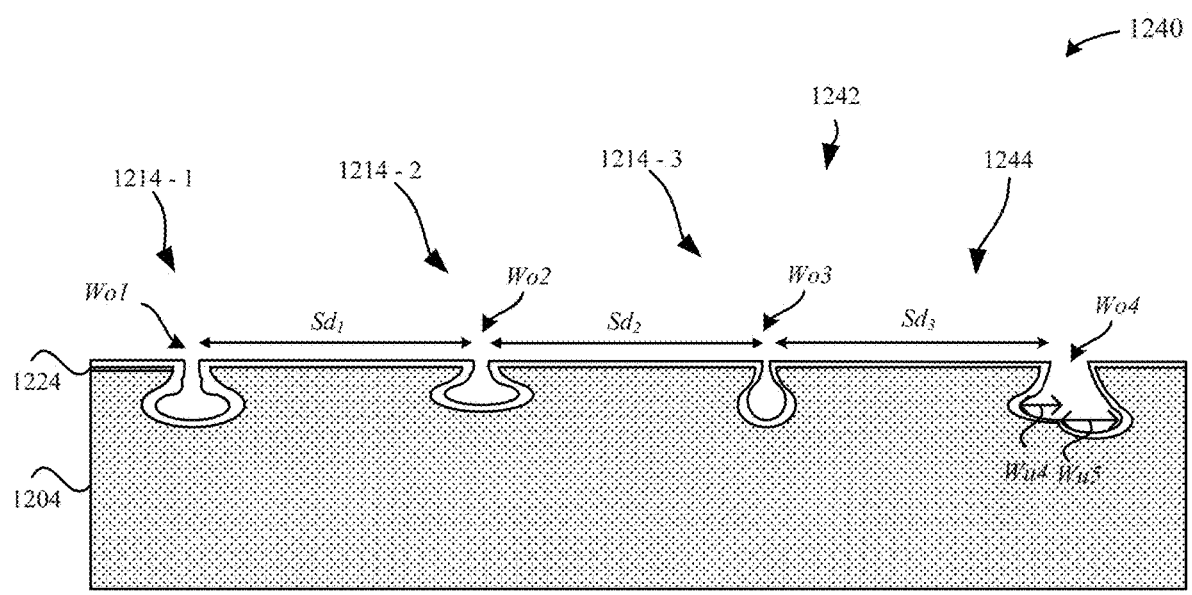

FIG. 12E illustrates a cross-sectional view of a bridged anodized metal part 1240, in accordance with some embodiments. In particular, the bridged anodized metal part 1240 is similar to the anodized metal part 1220 except for the inclusion of a bridged interlocking structure 1244. The bridged interlocking structure 1244 can include multiple interlocking structures 1214 that bridge or connect to each other. In some examples, the bridged interlocking structure 1244 is formed when neighboring interlocking structures are formed so close to each other that their respective undercut regions (Wu4, Wu5) connect.

Figure 13A:
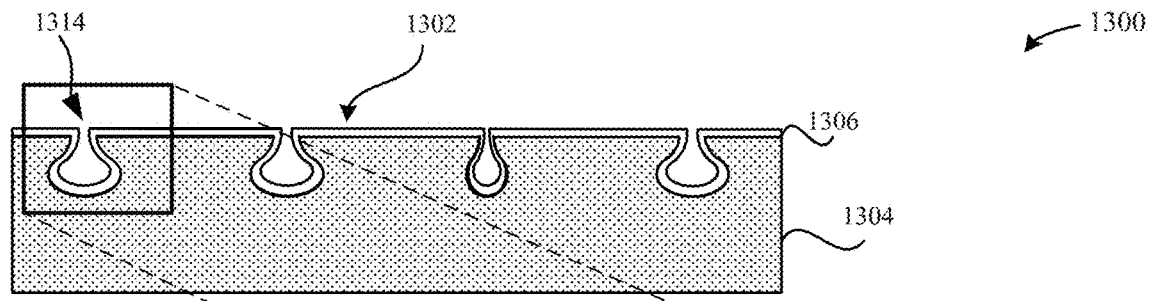
FIGS. 13A-13C illustrate various cross-sectional views of an anodized metal part having interlocking structures, in accordance with some embodiments.
Figure 13B:
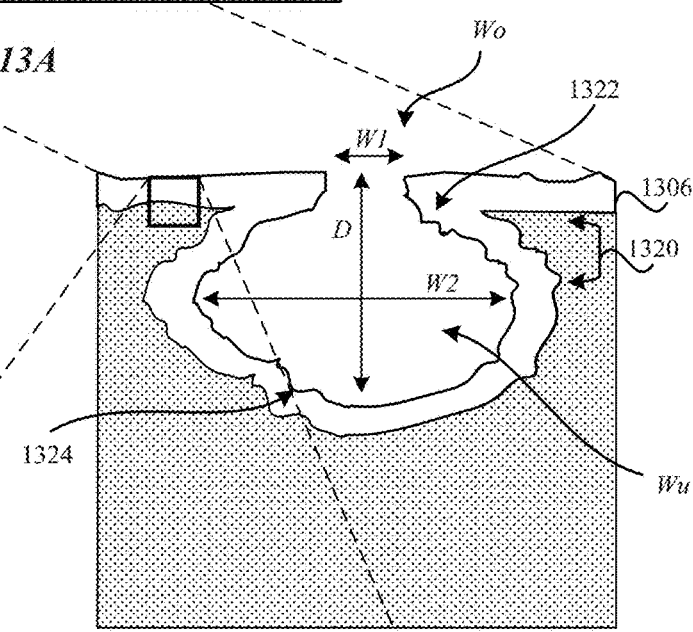
Figure 13C:
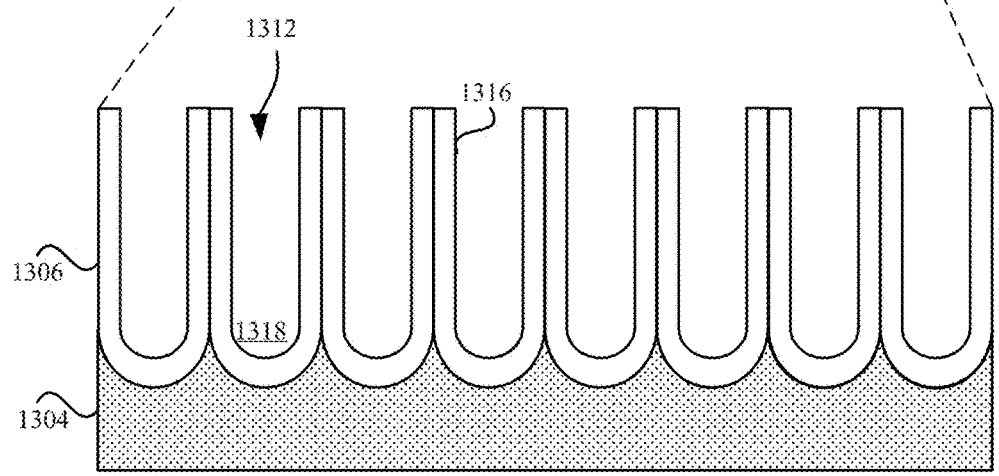

FIGS. 13A-13C illustrate various cross-sectional views of an anodized metal part having interlocking structures, in accordance with some embodiments. FIG. 13A illustrates an anodized metal part 1300 that may correspond to the anodized metal part 1220. FIG. 13A illustrates that the anodized metal part 1300 includes an interlocking structure 1314 that extends from an external surface 1302 and towards the metal substrate 1304. The interlocking structure 1314 can extend into portions of the metal substrate 1304, thus exposing portions of the metal substrate 1304. However, the metal oxide layer 1306 overlays the metal substrate 1304. The metal oxide layer 1304 can assume a shape that generally corresponds to the shape of the interlocking structure 1314.

FIG. 13B illustrates a magnified cross-sectional view of the interlocking structure 1314 of FIG. 13A, in accordance with some embodiments. The interlocking structure 1314 includes an opening (Wo) having a width (W1) that leads into an undercut region (Wu) capable of capturing and retaining the protruding portions—e.g., 1236—of the non-metal layer 1232 as described in greater detail herein. The undercut region (Wu) has a width (W2) that is greater than (W1). The undercut region (Wu) is defined by overhangs 1320, having a stepped shape that separates the opening (Wo) from the undercut region (Wu). In some embodiments, the opening (Wo) and the undercut region (Wu) are defined by walls 1324 having multi-angle side surfaces 1322. In some examples, the walls 1324 are formed of metal oxide material. It should be noted that the walls 1324 may assume a shape from the etched walls of the etched metal part 1210.

Additionally, FIG. 13B illustrates that the interlocking structure 1314 has a depth (D) that is greater than the width (W1) of the opening (Wo). In some examples, the width: depth ratio is between about 0.6 to about 0.9.

FIG. 13C illustrates a magnified cross-sectional view of the external surface 1302 of the anodized metal part 1300, in accordance with some embodiments. In particular, FIG. 13C illustrates that the metal oxide layer 1306 includes pore structures 1312 that extend from the external surface 1302 and towards the metal substrate 1304. The pore structures 1312 are generally columnar shapes that are elongated in a direction generally perpendicular to a central plane of the external surface 1302 of the anodized metal part 1300. Furthermore, the pore structures 1312 are defined by walls 1316. Additionally, the pore structures 1312 include bottom surfaces 1318 that may be filled with non-metal material. It should be noted that the pore structures 1312 are different from the interlocking structure 1314 in at least that the interlocking structure 1314 is formed as a result of an electrochemical etching process.

Figure 14A:
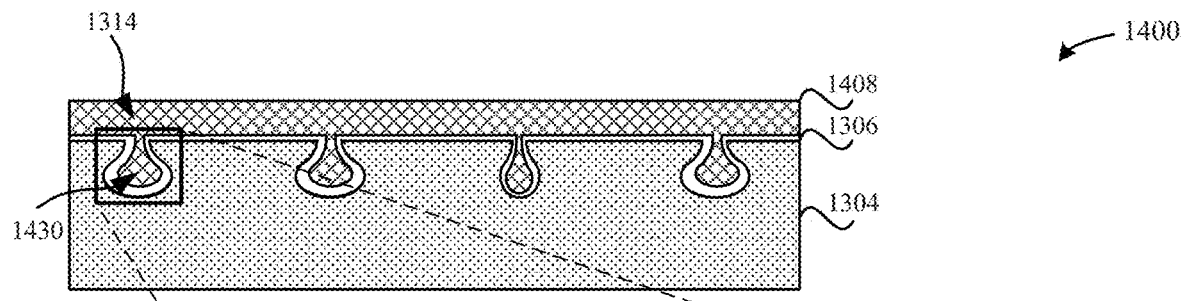
FIGS. 14A-14C illustrate various cross-sectional views of an anodized metal part that is bonded to a non-metal part, in accordance with some embodiments.
Figure 14B:
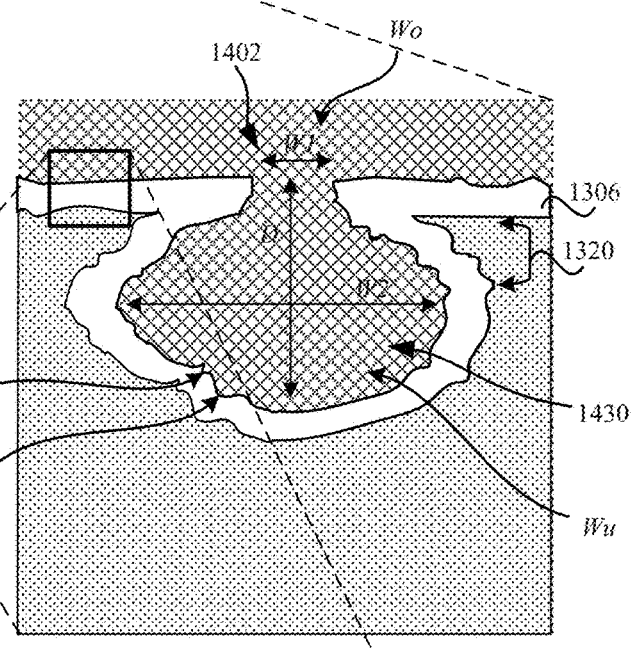
Figure 14C:
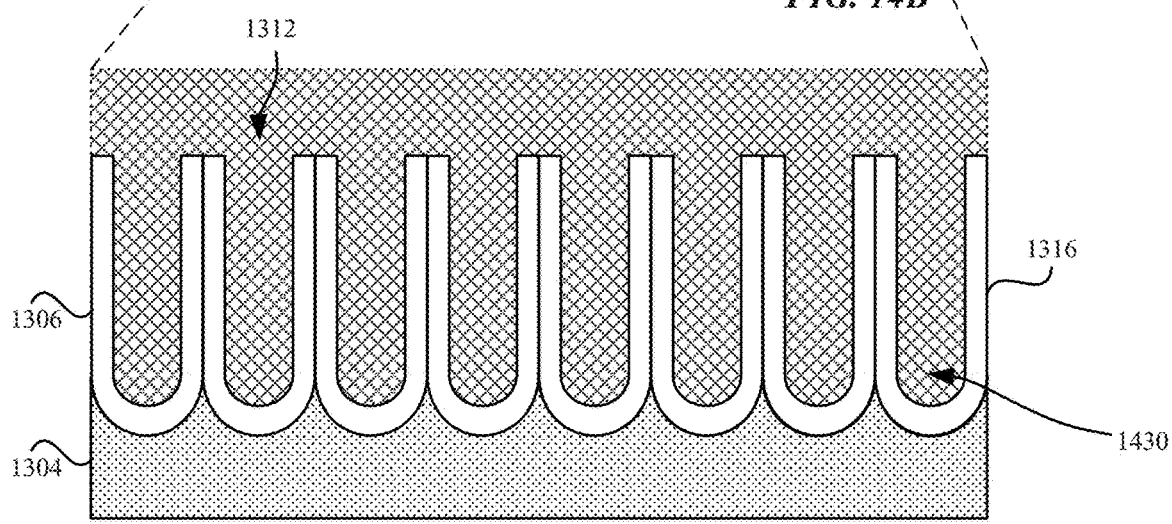

FIGS. 14A-14C illustrate various cross-sectional views of a multi-piece part having interlocking structures, in accordance with some embodiments. FIG. 14A illustrates a multi-piece part 1400 that may correspond to the multi-piece part 1230. FIG. 14A illustrates the anodized metal part 1300 of FIGS. 13A-13C is joined to a non-metal layer 1408 that includes a securing feature 1430 that extends into and is retained by the interlocking structure 1314 of the anodized metal part 1300. As illustrated in FIG. 14A, the material (e.g., aluminum) of the metal substrate 1304 that defines the interlocking structure 1314 is overlaid by a metal oxide layer 1306.

FIG. 14B illustrates a magnified cross-sectional view of the interlocking structure 1314 of FIG. 14A, in accordance with some embodiments. The interlocking structure 1314 includes an opening (Wo) having a width (W1) that leads into an undercut region (Wu) capable of capturing and retaining the securing feature 1430 of the non-metal layer 1408. The stepped shape that separates the opening (Wo) from the undercut region (Wu) is beneficial in providing increased hold between the interlocking structure 1314 and the non-metal layer 1408. The opening (Wo) and the undercut region (Wu) are defined by walls 1324 having multi-angle side surfaces 1322.

FIG. 14B illustrates that the multi-angle side surfaces 1322 may be filled or lined with non-metal material—e.g., securing features 1430. Beneficially, because the non-metal material fills in pockets formed by the multi-angle side surfaces 1322, there may be no air gaps or spacing between the protruding portions and the walls 1324. Additionally, it is noted that the multi-angle side surfaces 1322 can define a leak inhibition path that can inhibit moisture from reaching the metal substrate 1304. In particular, because the multi-angle side surfaces 1322 define multiple pockets that can be filled with the non-metal material, the leak inhibition path is characterized as having a non-uniform width and having tortuous, serpentine path that can inhibit moisture that enters by way of the opening (Wo) from bypassing the undercut region (Wu) to reach the metal substrates 1304.

FIG. 14C illustrates a magnified cross-sectional view of the external surface 1402 of the multi-piece part 1400, in accordance with some embodiments. In particular, FIG. 14C illustrates that pore structures 1312 of the metal oxide layer 1306 may be filled with non-metal material. For instance, the pore structures 1312 may be filled with the securing feature 1430 of the non-metal layer 1408. Beneficially, FIGS. 14A-14C illustrate that the non-metal layer 1408 is attached to the anodized metal part 1300 by way of the interlocking structure—e.g., 1314—and the pore structures—e.g., 1312, thereby enhancing hold and resistance to pull between the anodized metal part 1300 and the non-metal layer 1408. In some examples, the non-metal material of the non-metal layer 1408 that fills in and/or is retained within the pore structures 1312 may be referred to as chemical bonding at the nanometer scale, while the securing features 1430 that fill in and/or retained within the interlocking structures 1314 may be referred to as mechanical bonding at the micrometer scale.

FIGS. 15A-15B illustrate different perspective views of a part 1500 having multiple interlocking structures that are formed through an external surface of the part 1500, in accordance with some embodiments. FIG. 15A illustrates a top view of the part 1500 having interlocking structures 1514-1, 2, 3 that are etched into different regions of the external surface 1502 of the part 1500. Although FIG. 15A illustrates that the interlocking structures 1514-1, 2, 3 are formed discretely from each other, it should be noted that interlocking structures 1514 may also intersect with one another. In some examples, the openings of each of the interlocking structures 1514-1, 2, 3 are separated by a minimal separation distance such that walls do not overlap or destabilize with each other (e.g., does not affect shape or size of the undercut region).

According to some examples, the interlocking structures 1514 may cover between about 25% to about 70% of a total surface area of the external surface 1502. It should be noted that over-etching (X>70%) of the external surface 1502 may cause destabilization of the walls separating each of the interlocking structures 1514. Additionally, under-etching (X<25%) of the external surface 1502 may not permit for sufficient attachment points to the non-metal layer—e.g., the non-metal layer 1232.

FIG. 15B illustrates a perspective cross-sectional view of the part 1500 as indicated by the reference line 1510 in FIG. 15A. As illustrated in FIG. 15B, the part 1500 has multiple interlocking structures 1514-1, 2, 3. Each of the interlocking structures 1514 include an opening (Wo) that extends into an undercut region (Wu). In some examples, the ratio of the width of the opening (Wo) to the width of the undercut region (Wu) is between about 1:1.1 to 1:1.3. in some examples, the ratio of the width of the opening (Wo) to the width of the undercut region (Wu) is 1:2. Indeed, in some examples, increasing the disparity in the width of the opening (Wo) relative to the width of the undercut region (Wu) may increase pull strength between the part 1500 and the non-metal layer—e.g., the non-metal layer 1232.

Additionally, FIG. 15B illustrates that the interlocking structures 1514-1, 2, 3 are overlaid by a metal oxide layer 1506. The interlocking structures 1514-1, 2, 3 have diameters between about 20 micrometers to about 70 micrometers. The interlocking structures 1514 have a thickness of at least 5 micrometers. Although the interlocking structures 1514 may have a thickness of at least 50 micrometers in order for the interlocking structures 1514 to receive glass fibers from the non-metal layer 1232, from material such as polybutylene terephthalate (PBT) having 30% glass filler.

Figure 16:
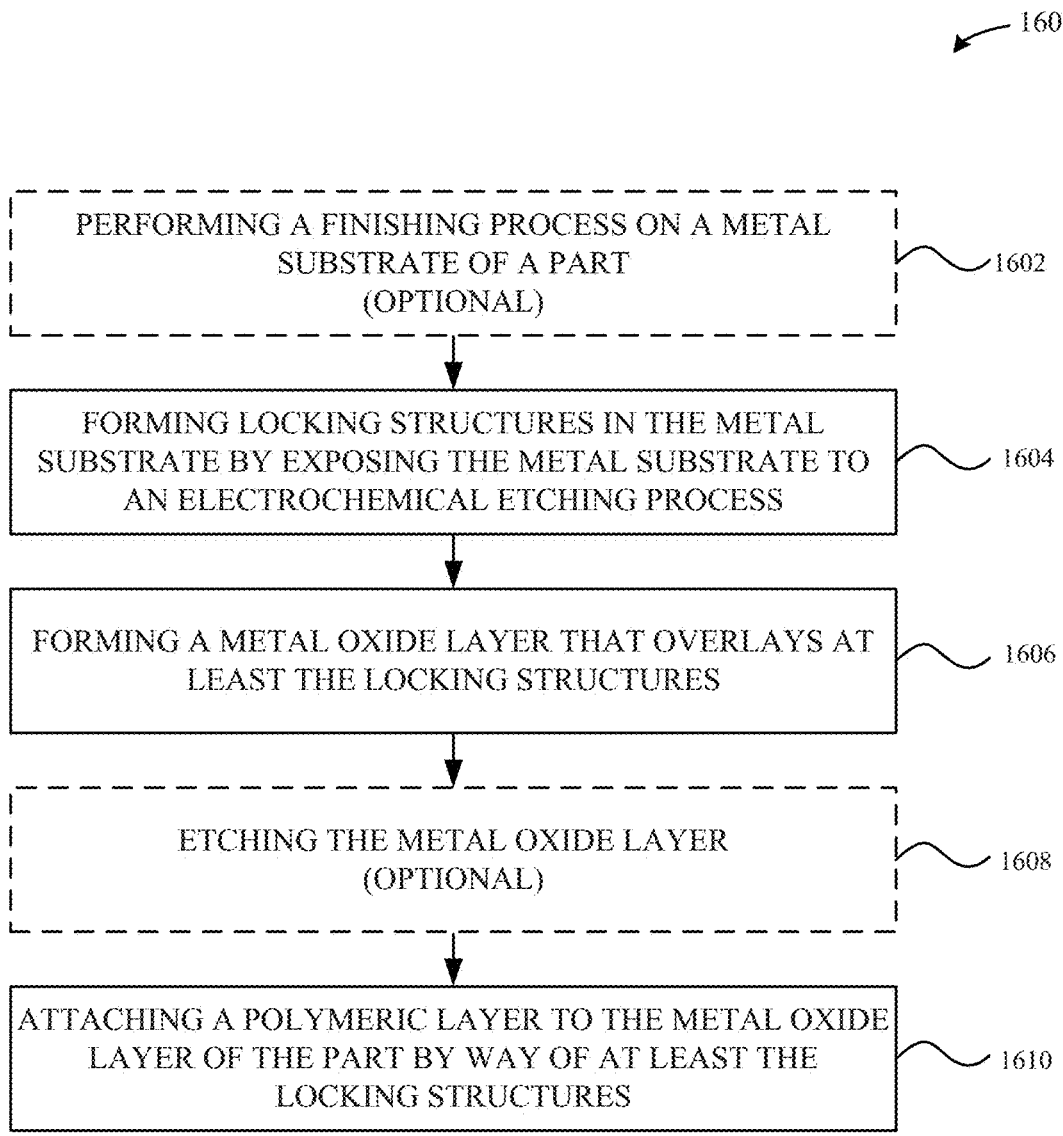
FIG. 16 illustrates a method for processing a metal part, in accordance with some embodiments.

FIG. 16 illustrates a method 1600 for bonding a polymeric layer to a metal part, in accordance with some embodiments. As illustrated in FIG. 16, the method 1600 may optionally begin at step 1602, where a part—e.g., a metal substrate 1204—is optionally treated with a finishing process. In some examples, the finishing process can include at least one of buffing, polishing, shaping, or texturizing an external surface of the metal substrate 1204. In some examples, the finishing process can include chemical cleaning (e.g., degreasing, acid etching, etc.) or rinsing the external surface of the metal substrate 1204.

At step 1604, locking structures—e.g., the interlocking structures 1214—may be formed at one or different regions of the external surface 1202 of the metal part 1200 by exposing the metal substrate 1204 to an electrochemical etching process. In particular, the electrochemical etching process involves exposing the metal part 1200 to an etching solution. In some examples, the etching solution may include an alkaline solution of sodium nitrate at a concentration between about 2-15 g/L. However, in other examples, the etching solution may include ferric chloride ($FeCl_3$) at a concentration between about 150-250 g/L. The metal part 1200 may be exposed to a pH of 9-11, with an anodic current density of 1-10 Amps/$dm^2$, for a period of between about 1 to 15 minutes. In some examples, predetermined regions of the external surface 1202 may be masked off using a combination of wax, tape, or other shielding technique during the electrochemical etching process.

In some examples, the metal part 1200 may be etched using a nitrate solution. For instance, the metal part 1200 may be exposed to the electrochemical etching process for an exposure time of 900 seconds, a pH level between about 9-12, and a sodium nitrate solution of between 0.5-2 g/L, at a temperature of between 35° C. and 45° C. In other examples, the metal part 1200 was subjected to an applied current density of ~1-10 A/$dm^2$.

Subsequently, at step 1606, a metal oxide layer 1224 is formed from the metal substrate 1204 as a result of an anodization process so as to form an anodized metal part 1220. The metal oxide layer 1224 overlays the metal substrate 1204 and the interlocking structures 1214. In some examples, the anodization process includes exposing the metal substrate 1204 to a phosphoric acid solution, ferric chloride, or sodium nitrate.

At step 1608, subsequent to and/or during the anodization process, the method 1600 optionally includes exposing the metal substrate 1204 to an etching process. For instance, the metal substrate 1204 is exposed to sodium nitrate, which may etch the metal oxide material and form multi-angle side surfaces 1322 within the walls 1324 of the metal oxide layer 1224 that define the interlocking structures 1314. Beneficially, the multi-angle side surfaces 1322 may define a serpentine path that prevents moisture from reaching the metal substrate 1304. Furthermore, the multi-angle side surfaces 1322 may increase the adhesion of the non-metal layer 1408 to the anodized metal part 1300.

At step 1610, a polymeric layer—e.g., the non-metal layer 1232—is attached to the metal oxide layer 1224. In particular, the non-metal layer 1232 can refer to a non-metal material that while in a liquid state can be allowed to flow into the interlocking structures 1214 of the anodized metal part 1220. When the non-metal material flows into these interlocking structures 1214, the non-metal material can penetrate into the undercut regions (Wu) of these interlocking structures 1214 and fill in the undercut regions (Wu) as well as the pore structures of the metal oxide layer 1224. After flowing into these undercut regions (Wu) and the pore structures, the non-metal material can be allowed to harden into protruding portions or attachment features 1236.

Figure 17:
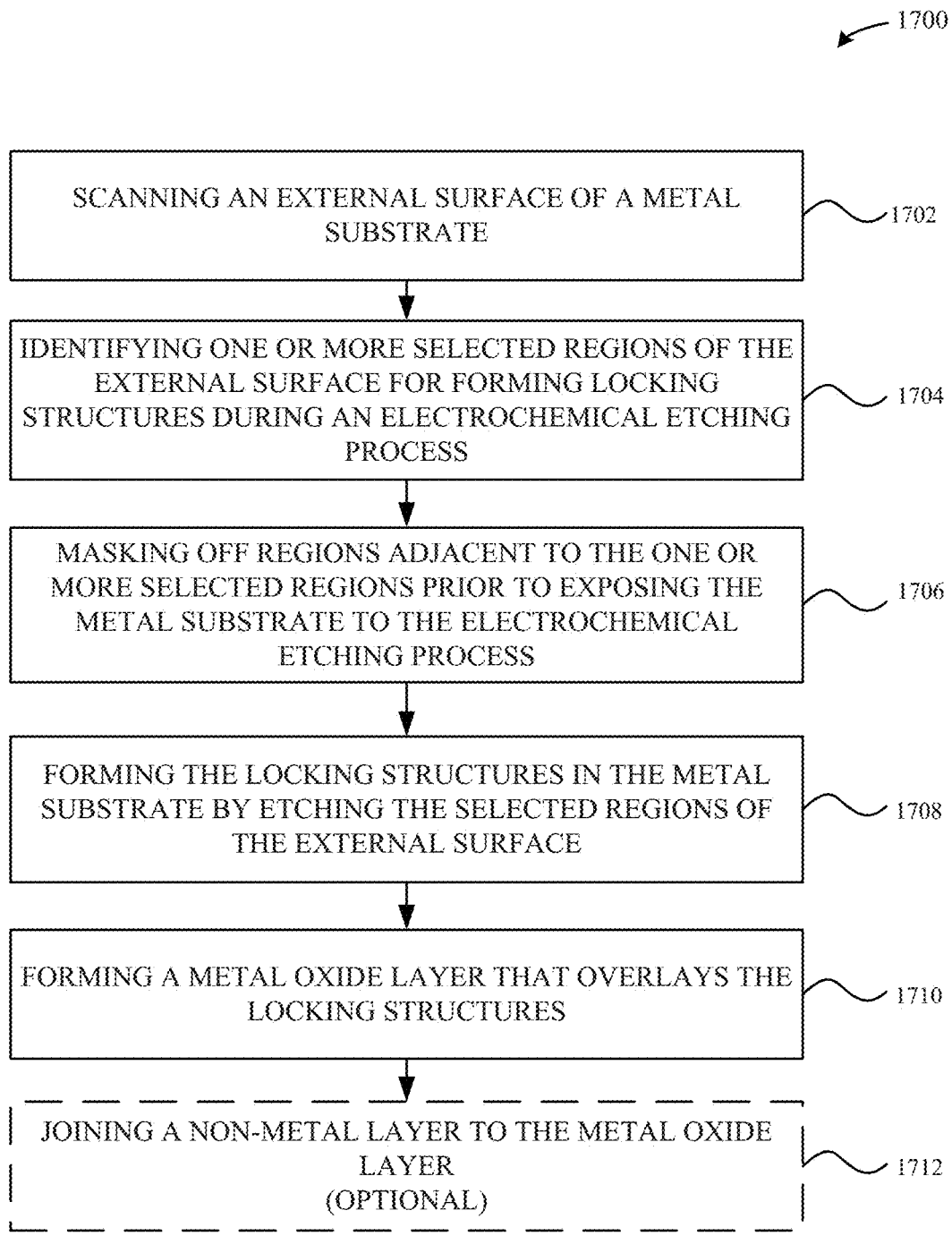
FIG. 17 illustrates a method for processing a metal part, in accordance with some embodiments.

FIG. 17 illustrates a method 1700 for joining a non-metal layer to a metal part, in accordance with some embodiments. As illustrated in FIG. 17, the method 1700 begins at step 1702 where an external surface of a part—e.g., a metal substrate 1204—is scanned using a 3-D image scanning system, electron microscope, or other suitable system.

At step 1704, the external surface 1202 can be scanned in order to identify regions where a non-metal layer 1232 is desired to be attached to those specific regions of the metal substrate 1204, such as if those regions correspond to parts of an external surface having a multi-layer enclosure or composite part.

At step 1706, regions of the external surface 1202 may be masked, such as by using a photolithography process. By masking these one or more regions, they are covered and generally prevented from being exposed to the etching process regardless of the chemical or metallurgical properties of these one or more regions.

At step 1708, locking structures—e.g., the interlocking structures 1214—may be formed at one or more selected regions of the external surface 1202 by exposing the unmasked regions of the external surface 1202 to the electrochemical etching process while preventing the masked regions from being etched. In addition to masking, other regions of the external surface 1202 which do not require etching may be protected using tape, wax, or shielding from the electrolyte using a polymer. Subsequent to the electrochemical etching process, any remaining etching solution present on the external surface 1202 can be cleaned by using deionized water such as to prevent the interlocking structures 1214 from further growing. In conjunction with step 1708, the concentration and/or number of interlocking structures 1214 that are formed within the external surface 1202 may be monitored and controlled. Additionally, the diameter and thickness of the interlocking structures 1214 may be monitored and controlled.

At step 1710, a metal oxide layer 1224 is formed from the metal substrate 1204 as a result of an anodization process so as to form an anodized metal part 1220. The metal oxide layer 1224 overlays the metal substrate 1204 and the interlocking structures 1214. In some examples, the anodization process includes exposing the metal substrate 1204 to a phosphoric acid solution. In some examples, the anodization process including exposing the metal substrate 1204 to an etching process.

At step 1712, the method 1700 includes optionally attaching a non-metal layer 1232 to the anodized metal part 1220 to form a composite part 1230. In particular, the non-metal layer 1232 can be bonded or attached to the anodized metal part 1220. In some examples, a finishing or cleaning process may be performed on the composite part 1230.

Figure 18:
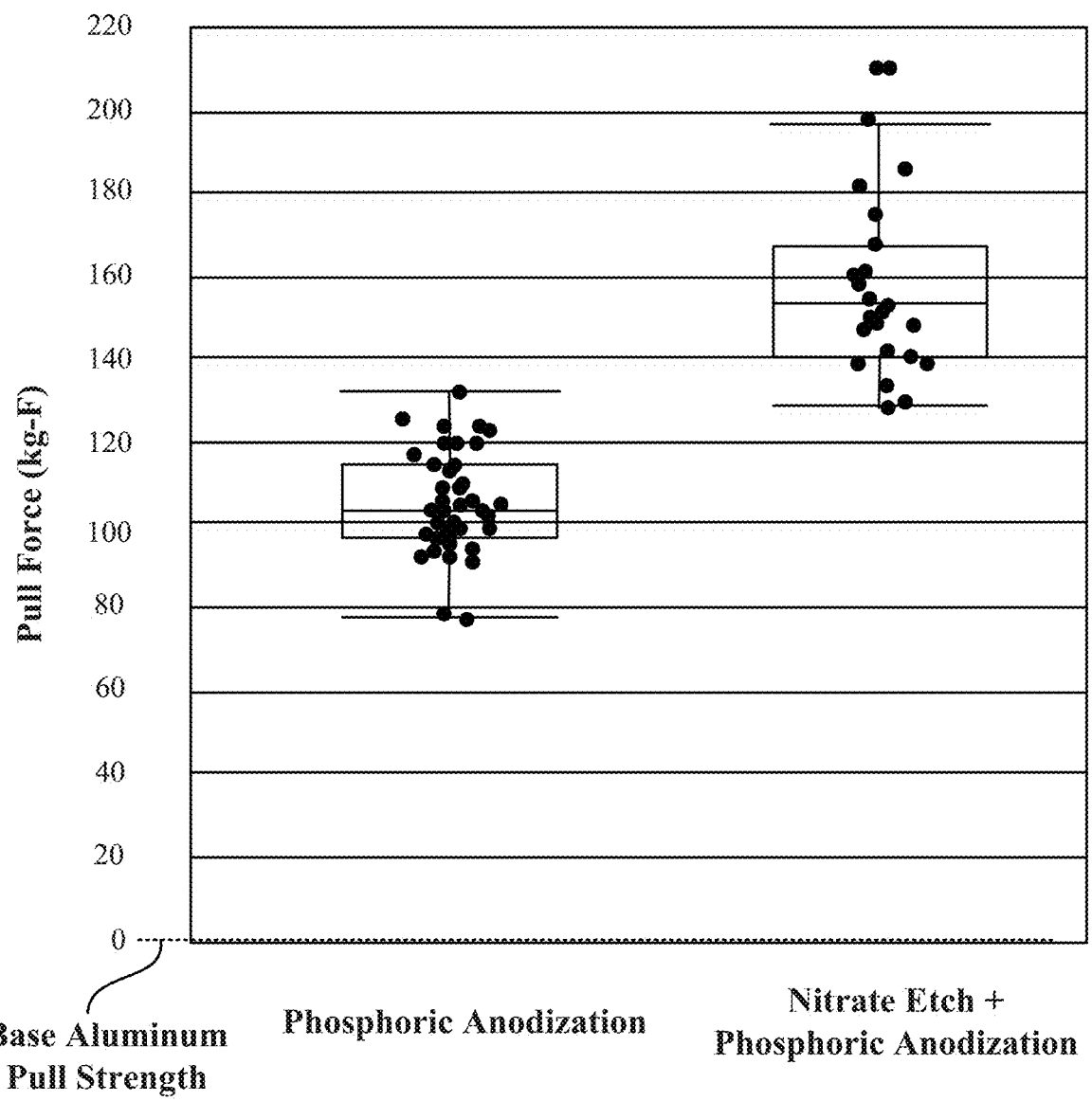
FIG. 18 illustrates a graph indicating a relationship between anodization process and pull strength of an anodized metal part, in accordance with some examples.

FIG. 18 illustrates a graph indicating a relationship of pull strength as a function of the type of processing of a metal part. In the exemplary trials, different metal parts that were attached to a non-metal layer were individually tested for pull strength. The different metal parts include (i) aluminum parts, (ii) anodized aluminum parts, and (iii) etched anodized aluminum parts were tested. The aluminum parts were neither etched to form interlocking structures nor anodized. In the exemplary trials, the aluminum parts exhibited a pull force of about 0 kg/F. The anodized aluminum parts were anodized using a phosphoric acid solution. The anodized aluminum parts exhibited a pull force of between about 78-135 kg/F. The etched anodized aluminum parts were etched to form interlocking structures using a nitrate solution and subsequently anodized using a phosphoric acid solution. The etched anodized aluminum parts exhibited a pull force of between about 130-210 kg/F. In some examples, the etched anodized aluminum parts more particularly exhibited a pull force of 157+/−21 kg/F. It should be noted that process of etching the anodized aluminum part with a nitrate solution to form interlocking structures is beneficial in increasing the pull strength between the etched anodized aluminum part and the non-metal layer.

Figure 19:
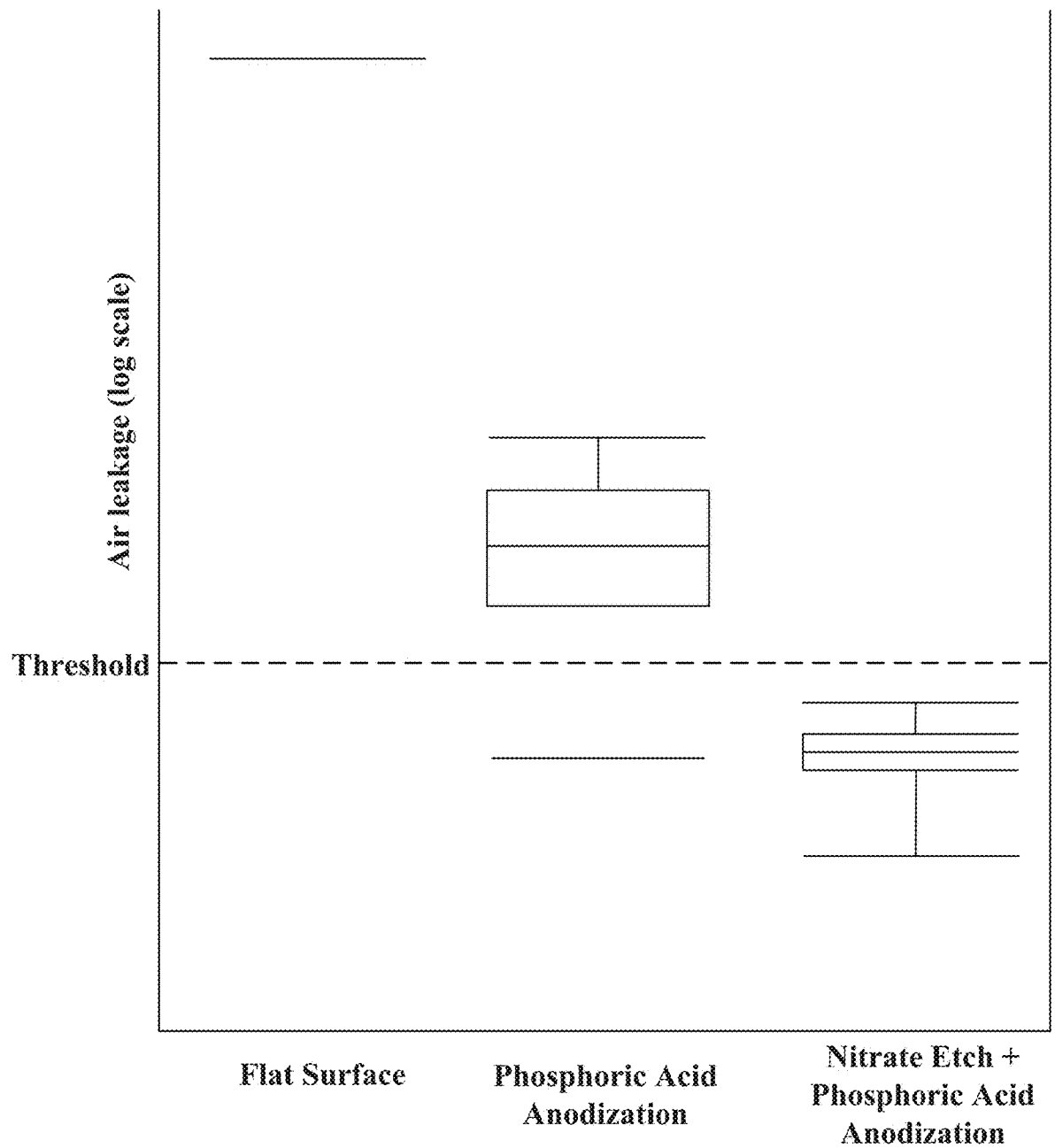
FIG. 19 illustrates a graph indicating a relationship between anodization process and air leakage of an anodized metal part, in accordance with some examples.

FIG. 19 illustrates a graph indicating a relationship of air leakage as a function of the type of processing of a metal part. In the exemplary trials, different metal parts that were attached to a non-metal layer were individually tested for air leakage. The different metal parts include (i) metal parts having a flat surface, (ii) anodized aluminum parts, and (iii) etched anodized aluminum parts were tested. The metal parts having the flat surface were neither etched nor anodized. In the exemplary trials, all of the metal parts having the flat surface exhibited an air leakage that was well below a threshold associated with air leakage resistance. The anodized aluminum parts were anodized using a phosphoric acid solution. All of the etched anodized aluminum parts exhibited air leakage ratings which satisfy the threshold for air leakage resistance. Thus, the exemplary trials demonstrate that etching metal part with a nitrate solution to form interlocking structures also decreases air leakage between the etched anodized aluminum part and the non-metal layer. This may demonstrate that relative to the anodized aluminum parts, the etched anodized aluminum parts minimize the number and/or size of air leakage junctions between the etched anodized aluminum part and the non-metal layer.

Figure 20:
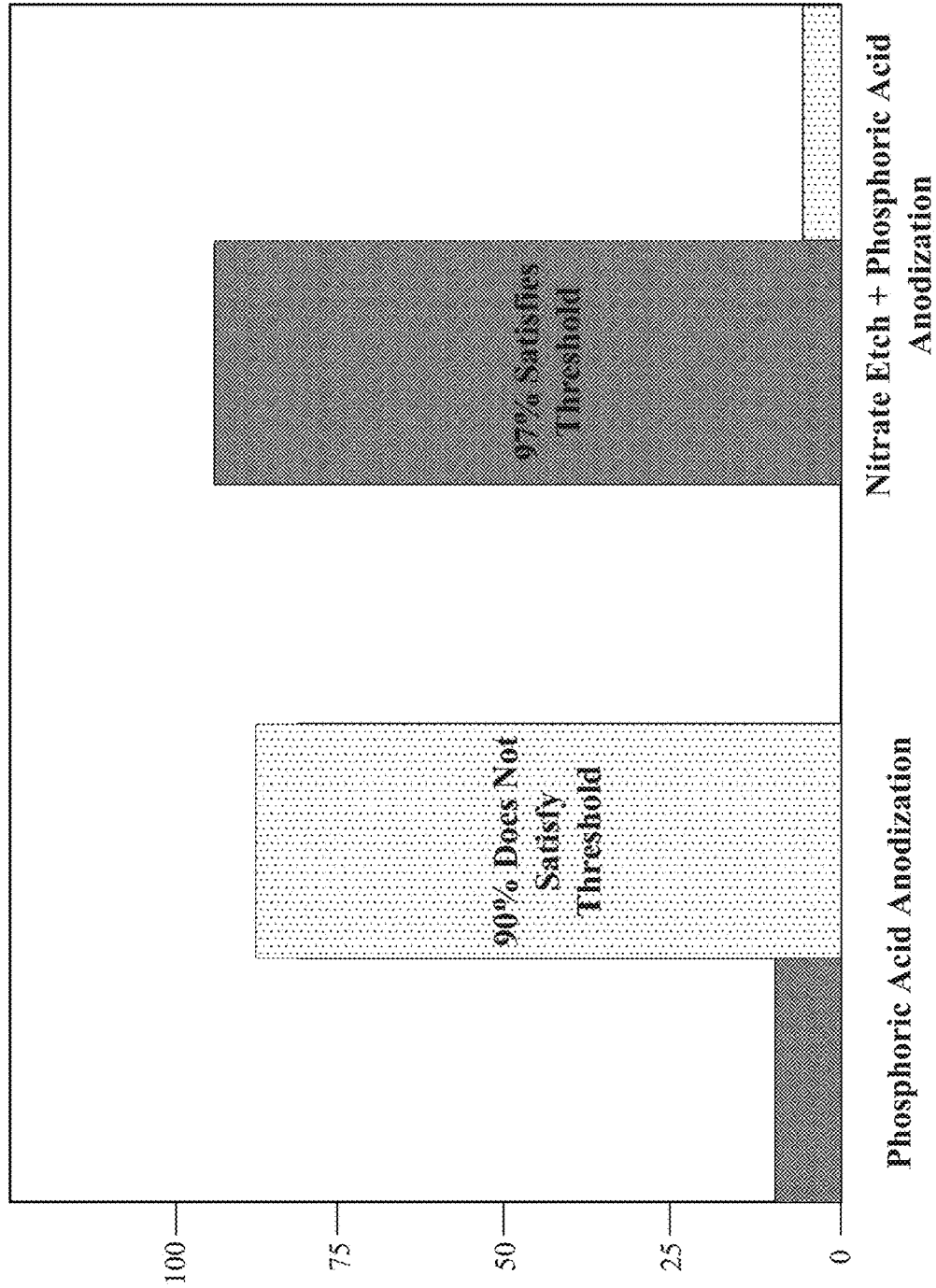
FIG. 20 illustrates a graph indicating a relationship between type of anodization process and air leakage of an anodized metal part, in accordance with some examples.

FIG. 20 illustrates a graph indicating a relationship of air leakage as a function of the type of processing of a metal part. In the exemplary trials, different metal parts that were attached to a non-metal layer were individually tested for air leakage. The different metal parts include (i) anodized aluminum parts, and (ii) etched anodized aluminum parts that were both anodized with phosphoric acid. 90% of the anodized aluminum parts exhibited an amount of air leakage that was below a threshold associated with air leakage. In contrast, 97% of the etched anodized aluminum parts exhibited an amount of air leakage that satisfied or exceeded the threshold associated with air leakage. In some examples, air leakage of anodized aluminum parts was measured at X<0.2 sccm at 0.6 bar.

FIGS. 21A-21C illustrate exemplary electron microscope images of an anodized metal part, in accordance with some embodiments. FIG. 21A illustrates a cross-sectional view of the anodized metal part 2102. As shown in FIG. 21A, the anodized metal part 2102 is attached to a polymeric layer 2110 including glass-reinforced plastic. At location A, the polymeric layer 2110 is attached to the anodized metal part 2102 at a flat surface 2104. At location B, the polymeric layer 2110 is attached to the anodized metal part 2102 via interlocking structure 2106.

FIG. 21B illustrates a magnified cross-sectional view of Location B. In particular, the glass fibers 2114 and the polymeric material 2112 of the polymeric layer 2110 fill in the interlocking structure 2106. In some examples, the interlocking structure 2106 has a thickness of at least 5 micrometers in order to receive the glass fibers 2114. The overhangs 2108 of the interlocking structure 2106 increase the amount of pull strength that would otherwise be required to detach the polymeric layer 2110 from the interlocking structure 2106.

FIG. 21C illustrates a magnified cross-sectional view of Location A. In particular, the pore structures of the metal oxide layer of the anodized metal part 2102 may not be large enough to receive the glass fibers 2114. However, the pore structures may be able to receive and be filled with the non-metal material (e.g., the polymeric material 2112).

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A composite part, comprising:
 a first part comprising:
  a substrate formed of a first material;
  a first oxide layer overlaying a first portion of the substrate, the first oxide layer defining an external surface and an opening having a first width at the external surface; and
  a second oxide layer distinct from the first metal oxide layer and overlaying a second portion of the substrate, the second oxide layer defining an interlocking structure that extends into the substrate, the interlocking structure defining an undercut region in communication with the opening, the undercut region having a second width that is greater than the first width; and
 a second part formed of a second material and comprising
  a bulk layer positioned at the external surface and micro-portions, the micro-portions comprising:
   a first portion that extends through the opening from the bulk layer; and
   a second portion that extends from the first portion and that completely fills and is retained within the undercut region.

2. The composite part of claim 1, wherein a ratio between the first width and the second width is 0.5:1 or greater.

3. The composite part of claim 1, wherein the interlocking structure has a depth between about 25 micrometers and about 200 micrometers.

4. The composite part of claim 1, wherein the undercut region is defined by etched walls having multi-angle side surfaces that define a serpentine path that inhibits moisture from reaching the substrate.

5. The composite part of claim 4, wherein the multi-angle side surfaces define cracks that are filled with the second material.

6. The composite part of claim 1, wherein the first material includes a steel alloy, and the second material includes a polymeric material.

7. The composite part of claim 1, wherein the first oxide layer has a first thickness and the second oxide layer has a second thickness that is less than the first thickness.

8. A multi-piece enclosure for an electronic device, comprising:
  a first piece comprising:
    a metal substrate;
    a first metal oxide layer overlaying the metal substrate, the first metal oxide layer defining an external surface and randomly distributed openings having a first width; and
    a second metal oxide layer different from the first metal oxide layer, the second metal oxide layer defining recessed structures having an undercut geometry and a second width, each recessed structure in communication with at least one randomly distributed opening and extending from the external surface and into the metal substrate, the recessed structures being separated from each other by at least a minimal separation distance; and
  a second piece formed of a non-metal material having a bulk portion with protruding features that extend through the openings and into and filling the recessed structures such that the first piece and the second piece are locked together.

9. The multi-piece enclosure of claim 8, wherein a junction between the first piece and the second piece at the recessed structures provides a serpentine path that inhibits a flow of liquid through the junction.

10. The multi-piece enclosure of claim 9, wherein the recessed structures include etched walls having multi-angle side surfaces that define the serpentine path.

11. The multi-piece enclosure of claim 10, wherein the etched walls of the recessed structures are structurally intact.

12. The multi-piece enclosure of claim 8, wherein a total surface area of the external surface includes the openings, and the openings account for between about 25% to about 65% of the total surface area.

* * * * *